(12) United States Patent
Nakajima et al.

(10) Patent No.: US 10,283,333 B2
(45) Date of Patent: May 7, 2019

(54) NANOCLUSTER PRODUCTION DEVICE

(71) Applicants: Japan Science and Technology Agency, Saitama (JP); Ayabo Corporation, Anjo-shi, Aichi (JP)

(72) Inventors: Atsushi Nakajima, Saitama (JP); Hironori Tsunoyama, Saitama (JP); Chuhang Zhang, Saitama (JP); Hiroki Akatsuka, Saitama (JP); Keizo Tsukamoto, Anjo (JP)

(73) Assignees: JAPAN SCIENCE AND TECHNOLOGY AGENCY, Saitama (JP); AYABO CORPORATION, Anjo-Shi, Aichi (JP)

( * ) Notice: Subject to any disclaimer, the term of this patent is extended or adjusted under 35 U.S.C. 154(b) by 149 days.

(21) Appl. No.: 14/893,775

(22) PCT Filed: May 26, 2014

(86) PCT No.: PCT/JP2014/063877
§ 371 (c)(1),
(2) Date: Nov. 24, 2015

(87) PCT Pub. No.: WO2014/192703
PCT Pub. Date: Dec. 4, 2014

(65) Prior Publication Data
US 2016/0111262 A1     Apr. 21, 2016

(30) Foreign Application Priority Data

May 29, 2013   (JP) .................................. 2013-112995

(51) Int. Cl.
*H01J 37/34*   (2006.01)
*H01J 37/32*   (2006.01)
(Continued)

(52) U.S. Cl.
CPC .......... *H01J 37/3467* (2013.01); *C23C 14/14* (2013.01); *C23C 14/3485* (2013.01);
(Continued)

(58) Field of Classification Search
CPC ..... C23C 14/3485; C23C 14/35; C23C 14/14; C23C 14/0063; H01J 37/3467;
(Continued)

(56) References Cited

U.S. PATENT DOCUMENTS 5,126,028 A * 6/1992 Hurwitt .................... C23C 14/04
204/192.13
5,622,606 A * 4/1997 Kugler ................ C23C 14/0063
204/192.12
(Continued)

FOREIGN PATENT DOCUMENTS

GB   2473655 A    3/2011
JP   61-261473 A  11/1986
(Continued)

OTHER PUBLICATIONS

International Search Report, PCTJP2014063877 with English translation.
(Continued)

*Primary Examiner* — Michael A Band
(74) *Attorney, Agent, or Firm* — Gavin J. Milczarek Desai; Quarles & Brady LLP

(57) ABSTRACT

Improvement of control of size and structure of nanoclusters with a nanocluster production apparatus is intended. Increase of an obtained amount and a yield of nanoclusters having size and structure, at least one of which is selected, is intended. A nanocluster production apparatus has a vacuum chamber, a sputtering source that generates plasma by pulse discharge, a pulse power supply that supplies a pulsed power to the sputtering source, a first inert gas supply
(Continued)

device that supplies a first inert gas to the sputtering source, a cluster growth cell stored in the vacuum chamber and a second inert gas introduction device that introduces a second inert gas into the cluster growth cell.

15 Claims, 18 Drawing Sheets

(51) Int. Cl.
*C23C 14/14* (2006.01)
*C23C 14/34* (2006.01)
*C23C 14/35* (2006.01)
*H01J 37/08* (2006.01)

(52) U.S. Cl.
CPC .............. *C23C 14/35* (2013.01); *H01J 37/08* (2013.01); *H01J 37/3244* (2013.01); *H01J 37/32715* (2013.01); *H01J 37/34* (2013.01); *H01J 37/3405* (2013.01); *H01J 37/3426* (2013.01); *H01J 2237/081* (2013.01); *H01J 2237/0812* (2013.01)

(58) Field of Classification Search
CPC ............... H01J 37/3405; H01J 37/3408; H01J 37/3426; H01J 37/34
See application file for complete search history.

(56) References Cited

U.S. PATENT DOCUMENTS

2006/0222790 A1* 10/2006 Roop ............... C23C 14/04
428/34.1
2009/0142584 A1 6/2009 Bedel et al.

FOREIGN PATENT DOCUMENTS

| JP | 10-168567 A | 6/1998 |
|---|---|---|
| JP | 2957161 B1 | 7/1999 |
| JP | 2001-011621 A | 1/2001 |
| JP | 2008-260999 A | 10/2008 |
| JP | 2012-099273 A | 5/2012 |
| WO | 2011105957 A1 | 9/2011 |

OTHER PUBLICATIONS

Written Opinion, PCTJP2014063877 with partial English translation.
Written Opinion of International Preliminary Report on Patentability, PCTJP2014063877 with partial English translation.
Zhang et al, Development of cluster ion source based on modulated pulse power magnetron sputtering technique, The 8th IEEE International Conference on Nano/Micro Engineered and Molecular Systems (NEWS 2013), IEEE, Apr. 7, 2013, pp. 428-431.
Akatsuka et al., Development of high-flux cluster ion source based on high power impulse magnetron sputtering technique, Book of Abstracts, Symposium on Size Selected Clusters 2013, Universitat Konstanz, Mar. 3, 2013, p. 63.
Pratontep, et al., Size-selected cluster beam source based on radio frequency magnetron plasma sputtering and gas condensation, Rev. Sci. Instrum. 76, 045103 (2005).
Heiz, et al., Chemical reactivity of size-selected supported clusters: An experimental setup, Rev. Sci. Instrum. 68, 1986-1994 (1997).
Stranak, et al., Size-controlled formation of Cu nanoclusters in pulsed magnetron sputtering systems, Surf. Coat. Technol., vol. 205, No. 8-9, pp. 2755-2762 (Jan. 25, 2011).
Xirouchaki et al., Deposition of size-selected metal clusters generated by magnetron sputtering and gas condensation: a progress review, (Univ. Birmingham, Birmingham, GBR), Phil. Trans. R. Soc. Lond A, vol. 362, No. 1814, pp. 117-124 (Jan. 15, 2004).
Lin, et al., Ion energy and mass distributions of the plasma during modulated pulse power magnetron sputtering, Surf. Coat. Technol., Voume 203, Issue 24, (Sep. 15, 2009), pp. 3676-3685.
JST-ERATO workshop handout, partial translation provided.
JST-ERATO workshop presentation material.
The Chemical Society of Japan, abstract.
Symposium on Size Selected Clusters 2013, poster.
Symposium on Size Selected Clusters 2013, abstract.
IEEE International Conference, poster.

* cited by examiner

NANOCLUSTER PRODUCTION DEVICE

TECHNOLOGICAL FIELD

The present invention relates to a nanocluster production apparatus.

BACKGROUND TECHNOLOGY

Characteristics of a nanocluster change remarkably even when the number of its constituent atoms increases or decreases by one. Therefore, development of technique for generating a nanocluster beam with controlled distribution of the number of constituent atoms of the nanocluster (hereinafter, referred to as cluster size) has been a challenge to be addressed.

Development of nanocluster sources using a magnetron sputtering method operated by a direct-current power supply (hereinafter, referred to as DC-MSP method) has lent some improvement to the efforts to the above challenge. For instance, Non-patent document 1 suggests a possibility that the cluster size can be controlled by mainly controlling helium (He) partial pressure (refer to FIG. 4 of Non-patent document 1). Non-patent document 2 describes an influence of the shape of a He gas nozzle on the cluster size (refer to FIG. 4 of Non-patent document 2).

However, solutions are still required for a challenge that the amount of the generated nanoclusters is small because the control of the size distribution is difficult and the intensity of the nanocluster ion beams after selection of cluster size is equal to or lower than several tens pA (0.6 to $3 \times 10^8$ particles per second), which is weak.

In addition, Patent documents 1 to 3 and Non-patent documents 3 to 5 should be referred to as related literatures.

PRIOR ART DOCUMENT

Patent Document

[Patent Document 1] GB2473655A
[Patent document 2] JP-A-2008-260999
[Patent document 3] JP Patent No. 2957161

Non-patent Document

[Non-patent document 1] "Size-selected cluster beam source based on radio frequency magnetron plasma sputtering and gas condensation", S. Pratontep, S. J. Carroll, C. Xirouchaki, M. Streun, R. E. Palmer, Rev. Sci. Instrum. 76, 045103 (2005)

[Non-patent document 2] "Chemical reactivity of size-selected supported clusters: An experimental setup", U. Heiz, F. Vanolli, L. Trento, W.-D. Schneider, Rev. Sci. Instrum. 68, 1986-1994 (1997)

[Non-patent document 3] "Size-controlled formation of Cu nanoclusters in pulsed magnetron sputtering system", STRANAK Viterslav, BLOCK Stephan, DRACHE Steffen, HUBICKA Zdenek, HELM Christiane A., JASTRABIK Lubomir, TICHY Milan, HIPPLER Rainer, Surf. Coat. Technol., Vol. 205, No. 8-9, Page. 2755-2762 (2011.01.25)

[Non-patent document 4] "Deposition of size-selected metal clusters generated by magnetron sputtering and gas condensation: a progress review", XIROUCHAKI C, PALMER R E (Univ. Birmingham, Birmingham, GBR), Phil. Trans. R. Soc. Lond. A, Vol. 362, No. 1814, Page. 117-124 (2004.01.15)

[Non-patent document 5] "Ion energy and mass distribution of the plasma during modulated pulse power magnetron sputtering", J. Lin, J. J. Moore, W. D. Sproul, B. Mishra, J. A. Rees, Z. Wu, R. Chistyakov, B. Abraham, Surf. Coat. Technol., Volume 203, Issue 24, (15 Sep. 2009), Page. 3676-3685

SUMMARY OF INVENTION

Problems to be Solved by Invention

Therefore, it is an object of the present invention to improve size control and structure control of nanoclusters in a nanocluster production apparatus. It is another object of the present invention to improve efficiency of production of nanoclusters to increase an obtained amount and a yield of the nanoclusters with at least one of selected size and selected structure.

Means for Solving Problems

According to a first aspect of the present invention, a nanocluster production apparatus has a vacuum chamber, a sputtering source that generates plasma by pulse discharge, a pulse power supply that supplies a pulsed power to the sputtering source, a first inert gas supply device that supplies a first inert gas to the sputtering source, a nanocluster growth cell placed in the vacuum chamber, and a second inert gas introduction device that introduces a second inert gas into the nanocluster growth cell.

Effects of Invention

With such the construction, as the pulsed power is supplied to the sputtering source, a stable discharge can be maintained even under a very high peak output, so an effective average output can be increased as compared to the DC-MSP method. Thus, the amount of the produced nanoclusters can be increased. In addition, selectivity of the size and the structure of the clusters can be improved.

According to a second aspect of the present invention, the nanocluster production apparatus further has a controller that controls the pulse power supply to vary a duty ratio of the pulsed power and a peak discharge power. By optimizing the duty ratio of the pulsed power and the peak discharge power using such the controller, the amount of the produced nanoclusters can be maximized. Also, selectivity of the size and the structure of the nanoclusters can be improved.

According to a third aspect of the present invention, in the above nanocluster production apparatus, the cluster growth cell has a beam extraction aperture for extracting the nanoclusters produced in the nanocluster growth cell as a beam, the sputtering source has a target as a cathode, a sputtering surface of the target and an inner surface of the nanocluster growth cell define a nanocluster growth space for a growth of nanoclusters, and the controller varies at least one of the duty ratio of the pulsed power and the peak discharge power according to at least one of length of the nanocluster growth space defined by distance extending from the sputtering surface of the target to the beam extraction aperture and temperature and pressure of the second inert gas in the nanocluster growth cell.

With such the construction, the duty ratio of the pulsed power and the peak discharge power can be optimized according to the apparatus construction and the nanocluster production conditions.

According to a fourth aspect of the present invention, in the above nanocluster production apparatus, the controller controls the pulse power supply to vary repetition rate of the pulsed power. By optimizing the repetition rate of the pulsed power using such the controller, the amount of the produced nanoclusters can be maximized. Also, selectivity of the size and the structure of the nanoclusters can be improved.

According to a fifth aspect of the present invention, in the above nanocluster production apparatus, the cluster growth cell has a beam extraction aperture for extracting the nanoclusters produced in the nanocluster growth cell as a beam, the sputtering source has a target as a cathode, a sputtering surface of the target and an inner surface of the nanocluster growth cell define a nanocluster growth space for a growth of nanoclusters, and the controller varies repetition rate of the pulsed power according to at least one of the length of the nanocluster growth space defined by distance extending from the sputtering surface of the target to the beam extraction aperture and temperature and pressure of the second inert gas in the nanocluster growth cell.

With such the construction, the repetition rate of the pulsed power can be optimized according to the apparatus construction and the nanocluster production conditions.

According to a sixth aspect of the present invention, in the above nanocluster production apparatus, the cluster growth cell has a beam extraction aperture for extracting the nanoclusters produced in the nanocluster growth cell as a beam, the nanocluster production apparatus further has a gate that permits or prohibits the extraction of the beam from the beam extraction aperture, and the controller sets timing of the gate for switching between the permission and the prohibition of the extraction of the beam from the beam extraction aperture, where the timing of the gate is triggered by start timing of the supply of the pulsed power to the sputtering source.

With such the construction, only beams reaching the beam extraction aperture in a specific time window can be extracted selectively by operating the gate. For instance, nanoclusters having specific size or structure can be deposited.

According to a seventh aspect of the present invention, in the above nanocluster production apparatus, the controller sets a period for permitting the extraction of the beam and a period for prohibiting the extraction of the beam from the beam extraction aperture as a regular pattern synchronized with the pulse discharge and repeats the permission and the prohibition of the extraction of the beam from the beam extraction aperture according to the set pattern and in synchronization with a repetition period of the pulsed power.

With such the construction, only beams reaching the beam extraction aperture in a specific time window synchronized with the repetition period of the pulsed power can be extracted repeatedly. Thus, the obtained amount and the yield of the nanocluster ions having specific characteristics can be improved. For instance, the yield may be defined as a ratio of the produced amount of the desired nanoclusters to the total amount of sputtered particles, which are supplied from the target of the sputtering source into the cluster growth cell.

According to an eighth aspect of the present invention, in the nanocluster production apparatus, the controller varies the timing for switching between the permission and the prohibition of the extraction of the beam, thereby controlling at least one of the size and the structure of the nanoclusters extracted through the beam extraction aperture.

In the case where the size or the structure of the nanoclusters produced in the repetition period of the pulsed power has time distribution, the size or the structure of the nanoclusters obtained through the beam extraction aperture can be controlled with the above construction.

According to a ninth aspect of the present invention, in the above nanocluster production apparatus, the gate permits or prohibits the extraction of the beam from the beam extraction aperture with an electric field, a magnetic field or an electromagnetic field. With such the construction, the gate having the above-mentioned action can be provided.

According to a tenth aspect of the present invention, in the above nanocluster production apparatus, the gate prohibits or permits the extraction of the beam from the beam extraction aperture by changing, blocking or unblocking a flight trajectory of the beam. Also with such the construction, the gate having the above-mentioned action can be provided.

According to an eleventh aspect of the present invention, the above nanocluster production apparatus further has another gate installed inside the cluster growth cell for permitting or prohibiting the passage of the nanoclusters.

With such the construction, the nanoclusters selected by the gate inside the cluster growth cell can be caused to further grow inside the cluster growth cell or can be controlled to accelerate or to decelerate, for instance.

According to a twelfth aspect of the present invention, in the above nanocluster production apparatus, the first inert gas is an argon gas.

Thus, plasma based on the argon gas can be produced.

According to a thirteenth aspect of the present invention, in the above nanocluster production apparatus, the second inert gas is a helium gas.

In this case, by using the helium gas as a coolant, the particles injected from the sputtering source can be cooled and condensed, whereby the particles can grow into the nanoclusters.

According to a fourteenth aspect of the present invention, in the above nanocluster production apparatus, the first inert gas supply device has a gas injector for the first inert gas, and the controller controls the sputtering source and the gas injector such that the gas injector injects the first inert gas intermittently and such that a period, in which the pulse discharge occurs on the sputtering source, is included in a period, in which the gas injector injects the first inert gas.

With such the construction, the first inert gas is injected and supplied intermittently with the injector. Therefore, the consumption of the first inert gas can be reduced as compared to the case where the first inert gas is supplied continuously. As a result, the sizes of the devices for supplying and evacuating the first inert gas can be reduced. Furthermore, according to the above aspect, the controller controls the sputtering source and the injector such that the period, in which the pulse discharge occurs on the sputtering source, is included in the period, in which the injector injects the first inert gas. Accordingly, even if the injection supply of the first inert gas is intermittent, a sufficient amount of the first inert gas can be supplied to the sputtering source at timing when the pulse discharge is performed. Thus, the generation of the plasma based on the first inert gas can be ensured.

Furthermore, partial pressure of the second inert gas such as the helium can be maintained high. Therefore, cooling efficiency of the nanoclusters can be improved while performing the stable sputtering.

According to a fifteenth aspect of the present invention, in the above nanocluster production apparatus, the controller supplies a power to the gas injector according to an injection signal, which is a pulsed electric signal, thereby driving the gas injector to inject the first inert gas, the controller constructs the injection signal with a group of a plurality of pulse signals, and the controller varies a duty ratio or frequency of the plurality of pulse signals in the group constructing the injection signal.

With such the construction, the injection volume of the first inert gas per unit time (i.e., injection rate) can be varied during a single injection period.

According to a sixteenth aspect of the present invention, in the above nanocluster production apparatus, the controller supplies a pulsed power to the sputtering source according to a sputtering signal, which is a pulsed electric signal, the controller constructs the sputtering signal with a group of a plurality of pulse signals, and the controller varies a duty ratio or frequency of the plurality of pulse signals in the group constructing the sputtering signal.

With such the construction, the temporal characteristics of voltage and current of pulsed power to the sputtering source can be changed arbitrarily, whereby a suitable discharge mode can be realized in accordance with an object such as increase of the amount of the nanoclusters.

EMBODIMENTS OF INVENTION

First Embodiment

Figure 1:
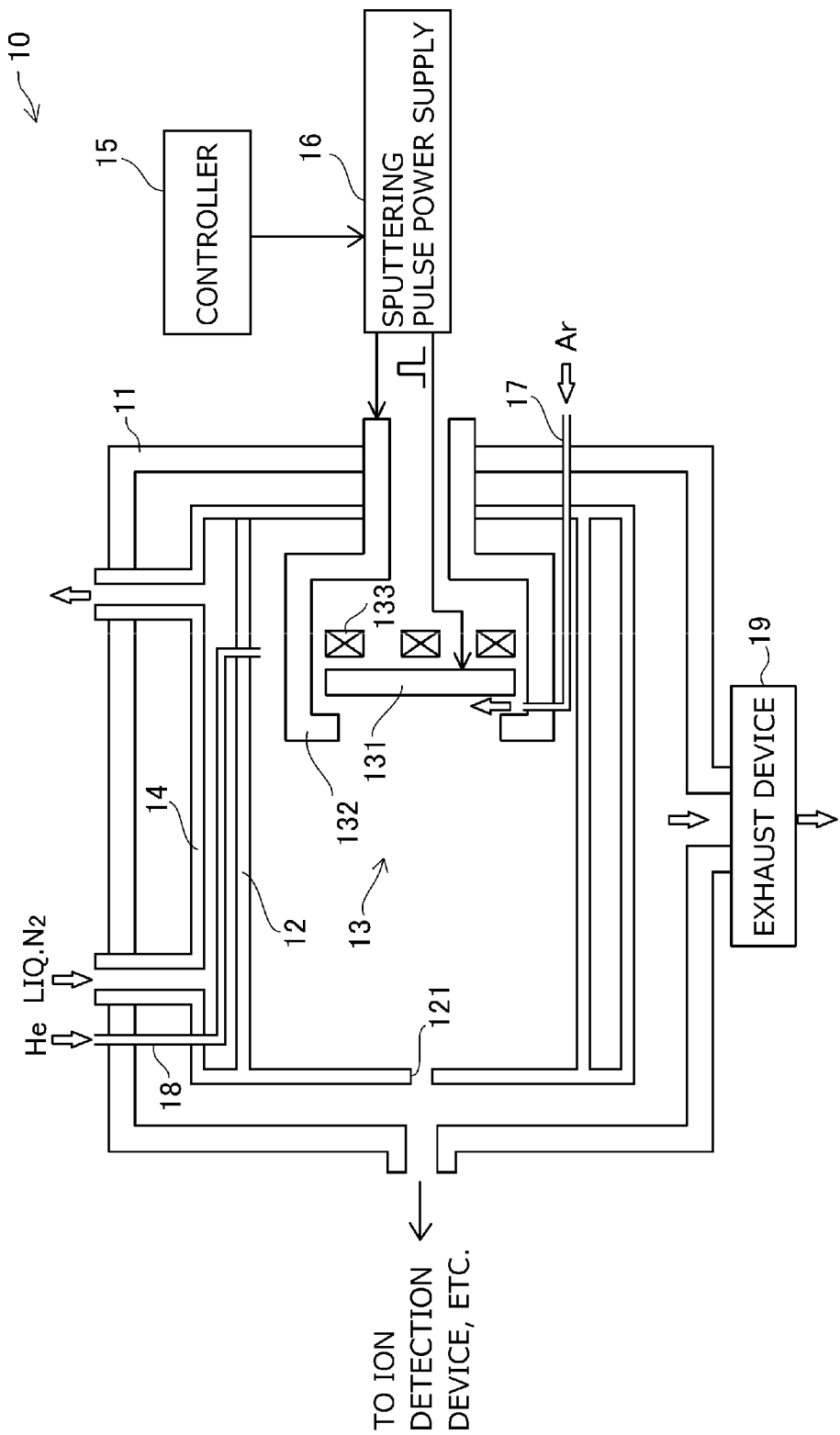
FIG. 1 is a conceptual construction diagram of a nanocluster production apparatus according to a first embodiment of the present invention.

Hereinafter, a nanocluster production apparatus 10 according to a first embodiment of the present invention will be explained. FIG. 1 is an illustrative diagram schematically showing a construction of the nanocluster production apparatus 10 according to the present embodiment. The nanocluster production apparatus 10 has a chamber 11, which is vacuumed, a nanocluster growth cell 12 installed in the chamber 11 and a sputtering source 13 (magnetron sputtering source) installed in the nanocluster growth cell 12. The nanocluster growth cell 12 according to the present embodiment is surrounded by a liquid nitrogen jacket 14. Liquid nitrogen ($N_2$) flows through the inside of the liquid nitrogen jacket 14. The nanocluster production apparatus 10 further has a controller 15 and a sputtering pulse power supply 16 as constituent components of a control system.

The nanocluster production apparatus 10 further has a first inert gas supply pipe 17 for supplying a first inert gas (for instance, argon gas (Ar)), which is used for generating plasma, to the sputtering source 13 and a second inert gas supply pipe 18 for supplying a second inert gas (for instance, helium gas (He)) into the nanocluster growth cell 12. The second inert gas is used for cooling and condensing neutral atoms and ions generating from the sputtering source 13 and for causing them to grow into nanoclusters. A main part of the second inert gas supply pipe 18 is housed in the liquid nitrogen jacket 14 and goes around spirally inside the liquid nitrogen jacket 14. A tip end of the second inert gas supply pipe 18 projects to an inside of the nanocluster growth cell 12.

Thus, the second inert gas such as the helium cooled by the liquid nitrogen can be introduced into the nanocluster growth cell 12. Pressure in the cluster growth cell 12 is maintained at approximately 2 to 40 Pa. Devices such as a pressure gauge connected to the cluster growth cell 12 for pressure control and a mass flow controller connected to the gas supply system are not shown in the drawings.

The nanocluster production apparatus 10 further has an exhaust device 19 constituted by a turbo-molecular pump and the like. With the exhaust device 19, the inside of the chamber 11 is evacuated to a predetermined pressure (for instance, $10^{-1}$ to $10^{-4}$ Pa).

The sputtering source 13 is constituted by a target 131 (for instance, metal target), an anode 132 and a magnet unit 133. The target 131 is connected to the sputtering pulse power supply 16 and serves as a cathode. When the Ar gas is supplied from the first inert gas supply pipe 17 to the inside of the nanocluster growth cell 12 and a pulsed electric power is supplied from the sputtering pulse power supply 16 (that is, pulsed high voltage is applied between target 131 and anode 132), a glow discharge arises between the target 131 and the anode 132. The nanocluster production apparatus 10 according to the present embodiment applies a magnetic field near the surface of the target 131 using the magnet unit 133, thereby performing magnetron sputtering. Thus, a strong glow discharge can be generated.

In this embodiment, the tip end of the first inert gas supply pipe 17 is constructed to inject the first inert gas from one or more apertures between the target 131 and the anode 132 of the sputtering source 13. However, the present invention is not limited to such the construction. Any construction can be employed as long as the first inert gas can be supplied to head to the target 131.

The sputtering source 13 is housed in the nanocluster growth cell 12 such that the sputtering source 13 can move freely in a tube axial direction. Thus, length of the nanocluster growth space in the tube axis direction (i.e., growth space length, or distance from surface of target 131 to beam extraction aperture 121) is defined.

In order to produce the nanoclusters, in a state where the second inert gas cooled to the liquid nitrogen temperature is introduced into the nanocluster growth cell 12, the first inert gas is supplied to the sputtering source 13 and the pulsed power is supplied from the sputtering pulse power supply 16. If the pulsed power is supplied, sputtered particles such as neutral atoms and ions originating from the target 131 are emitted as a bunch from the target 131 into the second inert gas.

This bunch is emitted at intervals of the repetition rate of the pulsed power applied to the sputtering source 13 and moves along the flow of the second inert gas. At this time, the sputtered particles such as the neutral atoms and ions constituting the bunch combine with each other in the second inert gas to produce the nanoclusters having various sizes. The produced nanoclusters pass through the beam extraction aperture 121 of the nanocluster growth cell 12 and then enter a subsequent ion detection device and the like.

Figure 2:
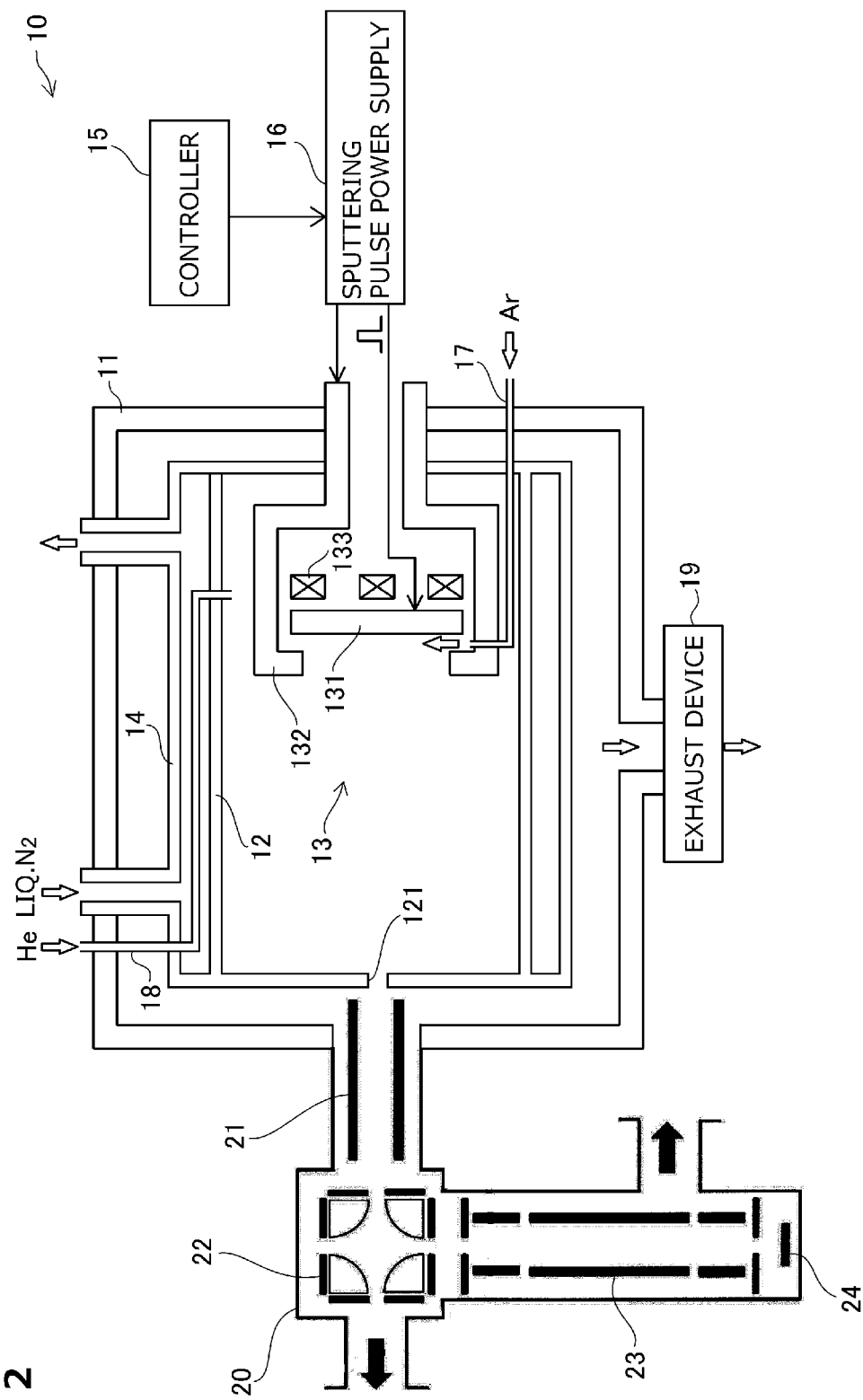
FIG. 2 is an illustrative diagram showing an example of combination of the nanocluster production apparatus according to the first embodiment and an ion detection device.

As the ion detection device, a detection device having a construction shown in FIG. 2 can be used, for instance. The ion detection device 20 shown in FIG. 2 has an ion guide electrode 21 outside a neighborhood of the beam extraction aperture 121 of the nanocluster growth cell 12. Thus, the nanocluster ions emitted from the beam extraction aperture 121 of the nanocluster growth cell 12 are guided. As shown in FIG. 2, the ion detection device 20 has a quadrupole ion deflector 22 placed downstream of the ion guide electrode 21. The quadrupole ion deflector 22 deflects and extracts either cations or anions out of the nanoclusters.

The ion detection device 20 has a quadrupole mass spectrometer 23 for analyzing the mass of the extracted nanocluster ions. Only the nanoclusters having the specific mass are extracted and the amount thereof is measured with an ion detector 24 capable of applying a bias connected to a picoammeter. For instance, a current of 100 pA measured with the ion detector 24 corresponds to an amount of the nanocluster ions of $0.6 \times 10^9$ particles per second (=1 fmol/s). Alternatively, if a deposition substrate is placed instead of the ion detector 24, only the nanocluster ions having the specific mass can be deposited on the substrate.

Working Example

Next, an example of production of the nanoclusters implemented with the nanocluster production apparatus 10 having the above-mentioned construction will be explained. Device specifications and experimental parameters of this example are as follows.

Sputtering source: ONYX-2 by Angstrom Sciences
Pulse power supply: AXIA-150 by Zpulser
Target: Ag (diameter: 2 inches, purity: 99.99%)
Ar gas flow rate: 40 to 200 sccm
He gas flow rate: 60 to 600 sccm
Pressure in growth cell: 10 to 40 Pa
Growth cell inner diameter: 110 mm
Growth space length: 190 to 290 mm
Beam extraction aperture diameter: 12 mm The nanocluster ions produced with the above-mentioned construction were detected with the ion detection device 20.

The sputtering pulse power supply 16 used in this example performs the discharge repeatedly in ON and OFF periods (ON period: $t_{ON}$, OFF period: $t_{OFF}$). The sputtering pulse power supply 16 is a modulated pulse power supply (Modulated Pulse Power: MPP) capable of controlling the power with a duty ratio ($t_{ON}/(t_{ON}+t_{OFF})$ or $t_{ON}/t_{TOT}$ wherein $t_{TOT}=t_{ON}+t_{OFF}$) and a direct-current voltage DCV. The sputtering pulse power supply 16 used in this example incorporates a pulse generator. The voltage DCV supplied from the power supply 16 can be controlled from 80 V to 600 V, and a peak voltage and a peak current change correspondingly. A peak discharge power is represented by the product of the peak voltage and the peak current.

Figure 3:
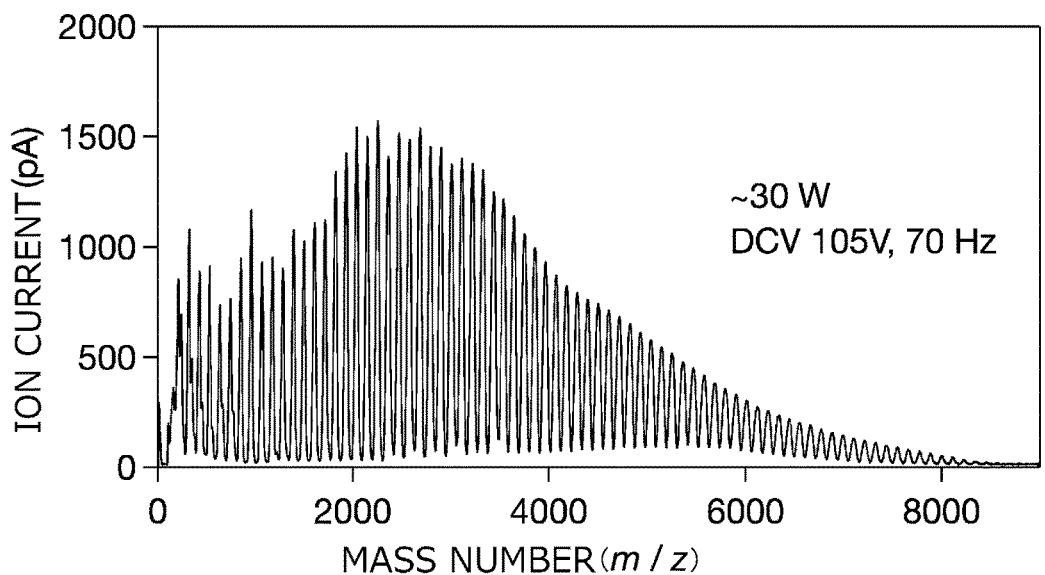
FIG. 3 is a graph showing a size distribution example of nanoclusters produced by the nanocluster production apparatus according to the first embodiment.

FIG. 3 is an explanatory diagram for explaining a size distribution of Ag nanocluster cations produced with the nanocluster production apparatus 10. FIG. 3 shows a mass spectrum in the case where an average discharge power of the sputtering pulse power supply 16 is set at approximately 30 W, the supplied voltage DCV is set at 105 V and the repetition rate of the discharge is set at 70 Hz. The horizontal axis indicates the mass number per unit charge (m/Z), and the vertical axis indicates the ion current (pA) equivalent to the produced amount of the nanocluster ions.

Figure 4:
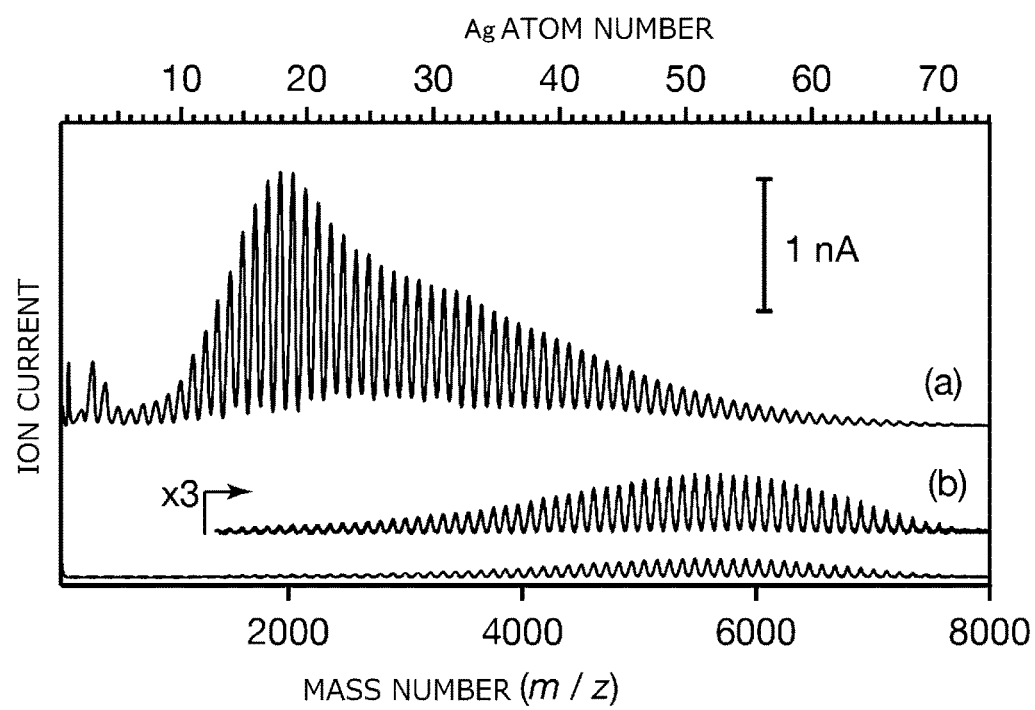
FIG. 4 is a diagram showing a comparison between mass spectra of nanocluster ions provided by the MPP-MSP method and the DC-MSP method.

FIG. 4 shows a mass spectrum (a) of Ag nanocluster anions obtained by the modulated pulse power magnetron sputtering method using the modulated pulse power supply (hereinafter, referred to as MPP-MSP method) and a mass spectrum (b) of Ag nanocluster anions obtained by the direct-current magnetron sputtering method (DC-MSP method) in comparison. In the MPP-MSP method, the repetition rate is set at 100 Hz, the peak discharge power is set at 200 W, and the average discharge power is controlled to approximately 30 W. The discharge power is set at 30 W in the DC-MSP method. In both cases, the flow rate of Ar is set to 100 sccm, and the flow rate of He is set to 600 sccm. FIG. 4 shows that the most dominant cluster size (n=19) in the MPP-MSP method has changed from the most dominant cluster size (n=54) in the DC-MSP method. It is also understood that the ion amount (1.9 nA) of the above-mentioned cluster size n=19 in the MPP-MSP method is approximately ten times larger than the ion amount (0.16 nA) of the above-mentioned cluster size n=54 in the DC-MSP method. It is also understood that the intensity of the nanocluster anions is higher in the case of the MPP-MSP method in the range of all the sizes produced.

Figure 5:
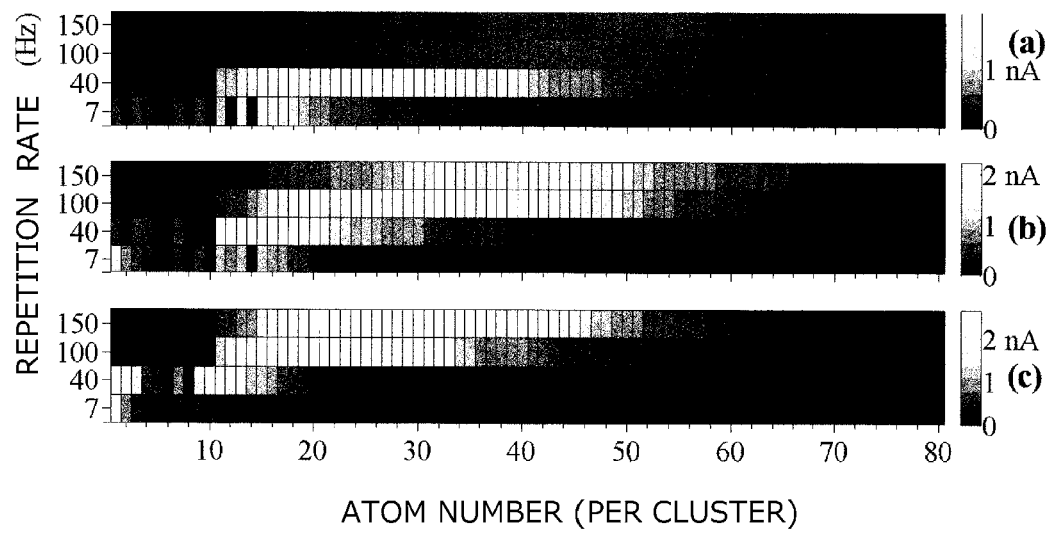
FIG. 5 is a diagram showing a relationship between control parameters of the MPP-MSP method and ion intensity.

FIG. 5 is a diagram showing that the ion intensity can be increased by controlling the parameters of the modulated pulse power supply. FIG. 5 shows the ion intensity of the Ag nanocluster anions in the case (a) where the discharge power is 370 W, the case (b) where the discharge power is 320 W and the case (c) where the discharge power is 210 W, respectively. The horizontal axis of the diagram indicates the number of the atoms per nanocluster, and the vertical axis indicates the repetition rate of the pulse discharge. The brighter (closer to white) the tone of each cell in the diagram is, the higher the ion intensity is. In this example, a duration time of generation of each pulse discharge was set to be constant (approximately 1 ms). Therefore, the duty ratio of the pulse discharge is proportional to the repetition rate (that is, duty ratio is approximately 0.007 to 0.15 with respect to repetition rate of 7 to 150 Hz). It can be understood from FIG. 5 that the ion intensity (obtained amount and yield) can be improved by two-dimensional control (optimization) of the peak discharge power and the repetition rate (or duty ratio) of the discharge.

Figure 6:
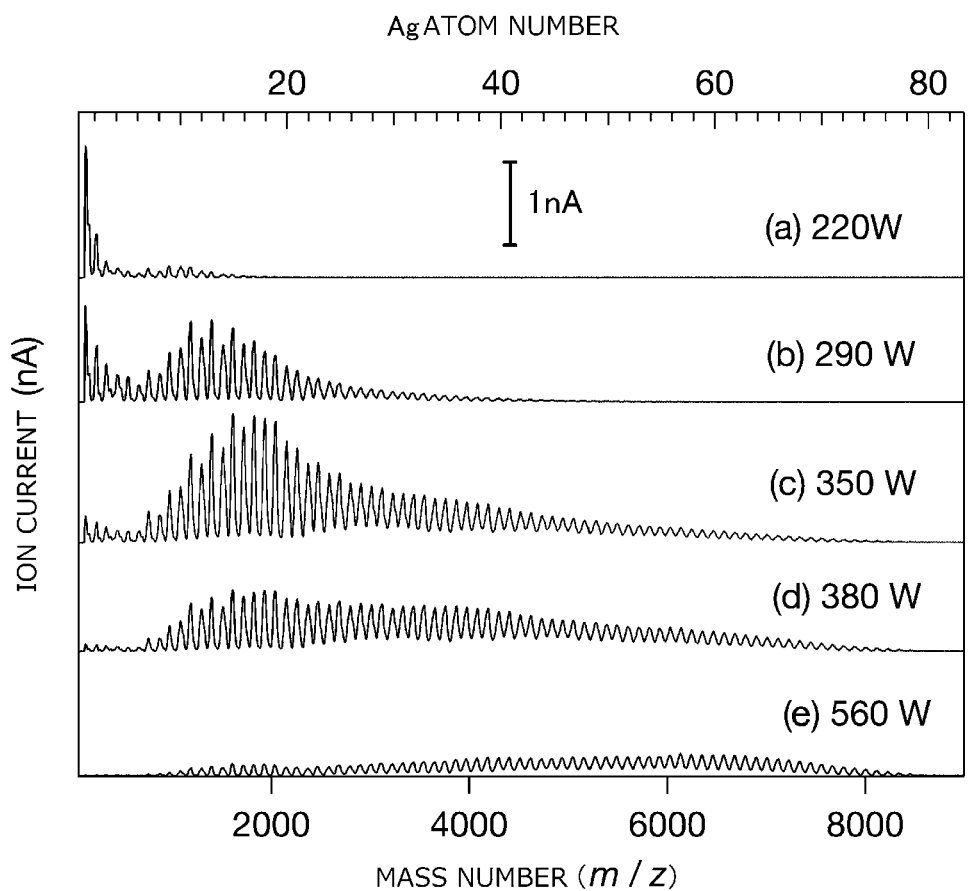
FIG. 6 is an illustrative diagram for explaining an influence of a discharge power on cluster size and the ion intensity in the MPP-MSP method.

FIG. 6 is an explanatory diagram for explaining an influence on the cluster size and the ion intensity in the case where the peak discharge power is changed in the MPP-MSP method. In the example of FIG. 6, the size distributions of the Ag nanocluster anions in the cases where the peak discharge power is set to (a) 220 W, (b) 290 W, (c) 350 W, (d) 380 W and (e) 560 W respectively are shown in an offset manner. In every case, the flow rate of Ar was set to 120 sccm, the flow rate of He was set to 600 sccm, and the discharge repetition rate was set to 10 Hz. It can be understood from FIG. 6 that the distribution of the cluster size changes depending on the peak discharge power, that is, there is a tendency that the distribution of the cluster size shifts toward a larger side as the peak discharge power increases.

Figure 7:
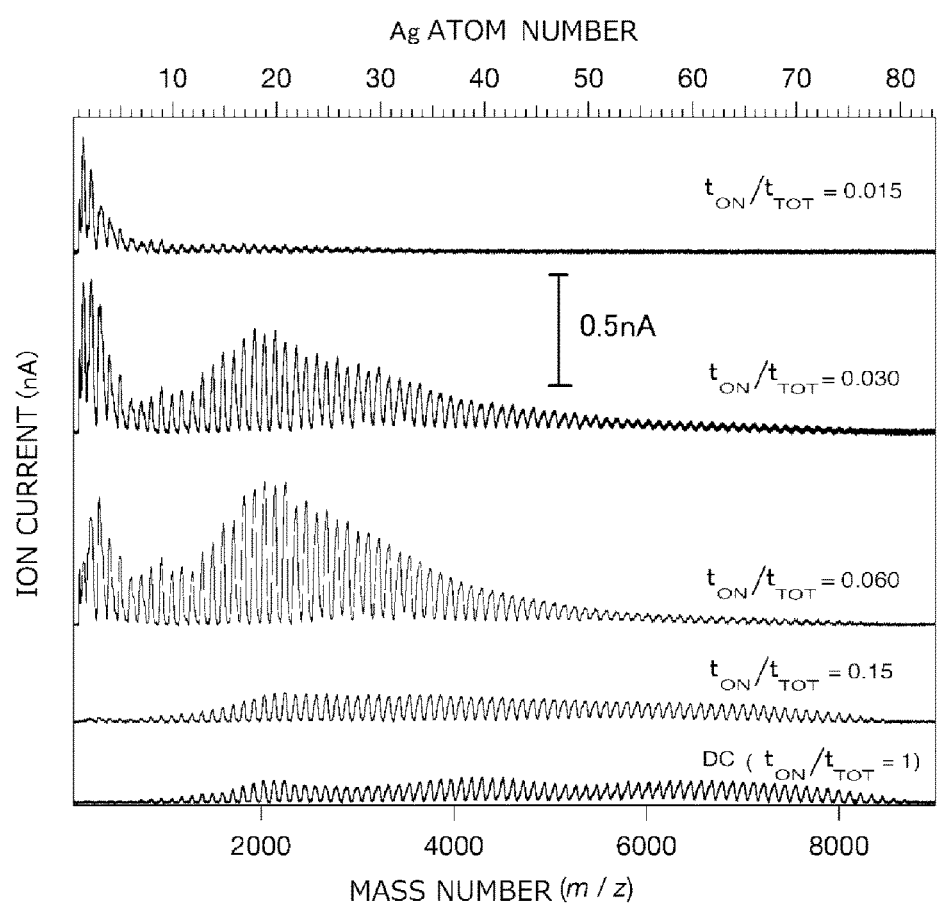
FIG. 7 is an illustrative diagram for explaining an influence of a discharge duty ratio on the cluster size and the ion intensity in the MPP-MSP method.

FIG. 7 is an explanatory diagram for explaining an influence on the Ag nanocluster size and the ion intensity in the case where the duty ratio $t_{ON}/t_{TOT}$ of the discharge is changed in the MPP-MSP method. From the upper side of the diagram, results in the cases where the duty ratio $t_{ON}/t_{TOT}$ is set to 0.015, 0.03, 0.06 and 0.15 respectively are shown in an offset manner. A result in the case where the duty ratio $t_{ON}/t_{TOT}=1$, i.e., in the case of the DC-MPP method, is also shown for comparison. As shown in FIG. 7, the most dominant cluster size has changed from n=58 in the case where the duty ratio=1 in the DC-MPP method to n=19 in the case where the duty ratio $t_{ON}/t_{TOT}=0.06$. In addition, it was found that the ion intensity corresponding to each cluster size can be increased to 700 pA (n=19) in the case where the duty ratio $t_{ON}/t_{TOT}=0.06$ from 150 pA (n=58) in the case where the DC-MPP method is used, thus, it was found that the ion intensity can be increased by approximately 4.7 times as compared to the case of the DC-MPP method. It can be also understood from FIG. 7 that there exists a range of the duty ratio $t_{ON}/t_{TOT}$ where the ion intensity in a specific range of the size distribution is optimized. The ion intensity is high as a whole in the case where the duty ratio $t_{ON}/t_{TOT}$ is 0.03 or 0.06 as compared to the other cases.

Figure 8:
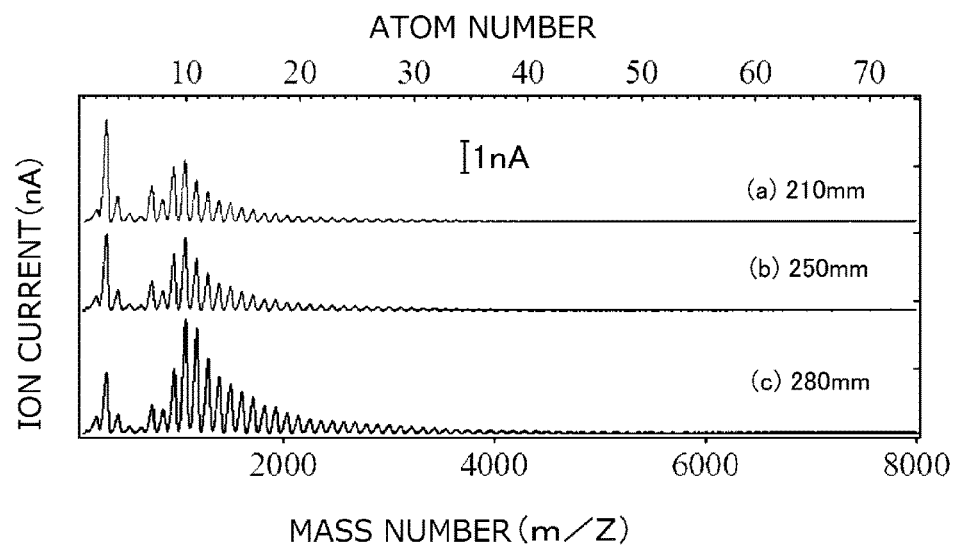
FIG. 8 is an illustrative diagram for explaining an influence of length of nanocluster growth space on the cluster size and the ion intensity.

FIG. 8 is an explanatory diagram for explaining an influence of the cluster growth space length on the Ag nanocluster size and the ion intensity and shows the case (a) of 210 mm, the case (b) of 250 mm, and the case (c) of 280 mm respectively in an offset manner. In every case, the flow rate of Ar was set to 80 sccm, the flow rate of He was set to 600 sccm, the supplied voltage DCV was set to 90 V and the repetition rate of the discharge was set to 70 Hz.

Figure 9:
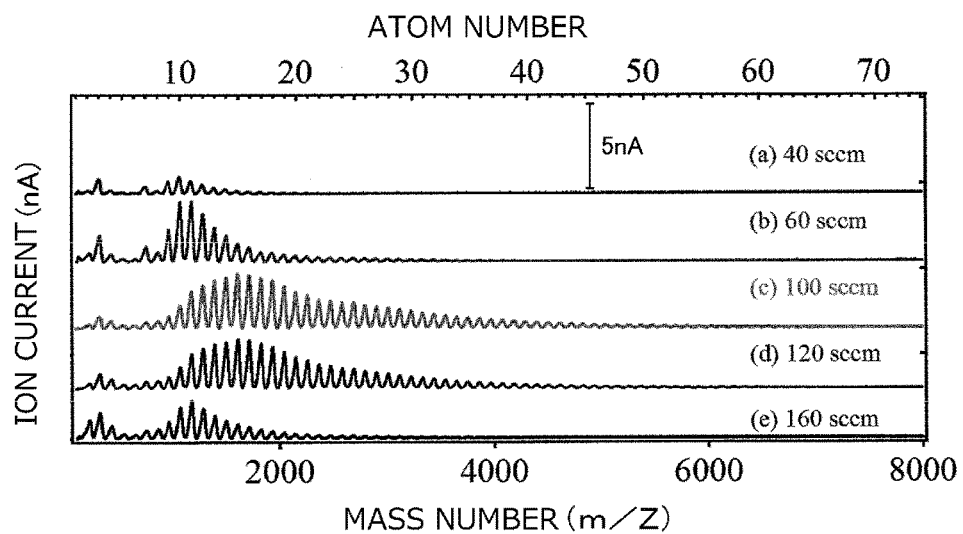
FIG. 9 is an illustrative diagram for explaining an influence of change of an argon gas flow rate on the cluster size and the ion intensity.

FIG. 9 is an explanatory diagram for explaining an influence of the Ar gas flow rate on the Ag nanocluster size and the ion intensity and shows the cluster size distributions in the cases where the Ar gas flow rate is (a) 40 sccm, (b) 60 sccm, (c) 100 sccm, (d) 120 sccm and (e) 160 sccm respectively. In every case, the flow rate of the He gas was set to 600 sccm, the cluster growth space length was set to 290 mm, the supplied voltage DCV was set to 90 V and the repetition rate of the discharge was set to 70 Hz.

Figure 10:
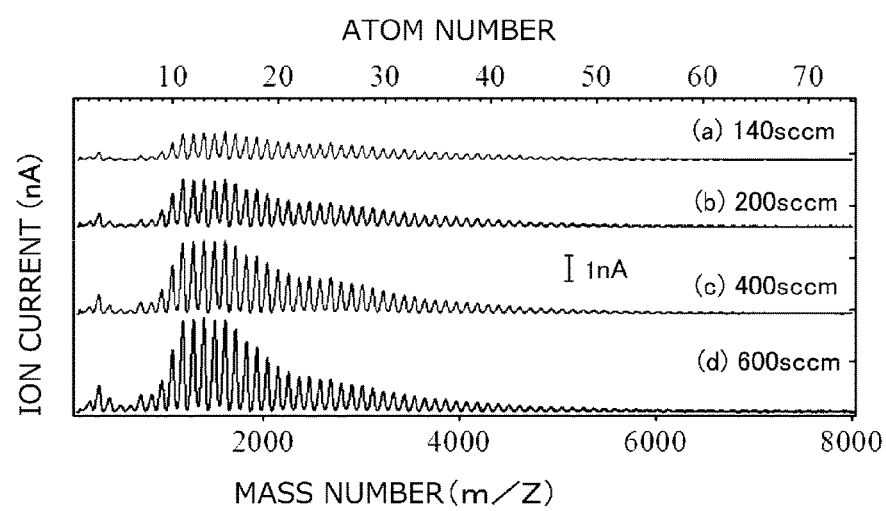
FIG. 10 is an illustrative diagram for explaining an influence of change of a helium gas flow rate on the cluster size and the ion intensity.

FIG. 10 is an explanatory diagram for explaining an influence of the change of the He gas flow rate on the Ag nanocluster size and the ion intensity and shows the cluster size distributions in the cases where the He gas flow rate is (a) 140 sccm, (b) 200 sccm, (c) 400 sccm and (d) 600 sccm respectively in an offset manner. In every case, the flow rate of the Ar gas was set to 80 sccm, the cluster growth space length was set to 290 mm, the supplied voltage DCV was set to 90 V and the repetition rate of the discharge was set to 70 Hz.

It can be understood from these FIGS. 8 to 10 that the size distribution and the ion intensity of the Ag nanocluster anions change depending on the cluster growth space length, the Ar gas flow rate and the He gas flow rate.

As mentioned above, the nanocluster production apparatus 10 according to the present embodiment uses the magnetron sputtering method for applying the pulsed power. Therefore, the size selectivity of the produced nanoclusters improves and the obtained amount and the yield improve as compared to the conventional direct-current power magnetron sputtering method.

Furthermore, the size selectivity of the produced nanoclusters can be improved by controlling the repetition rate of the pulsed power, the peak discharge power or the pulse waveform (duty ratio).

Second Embodiment

Figure 11A:
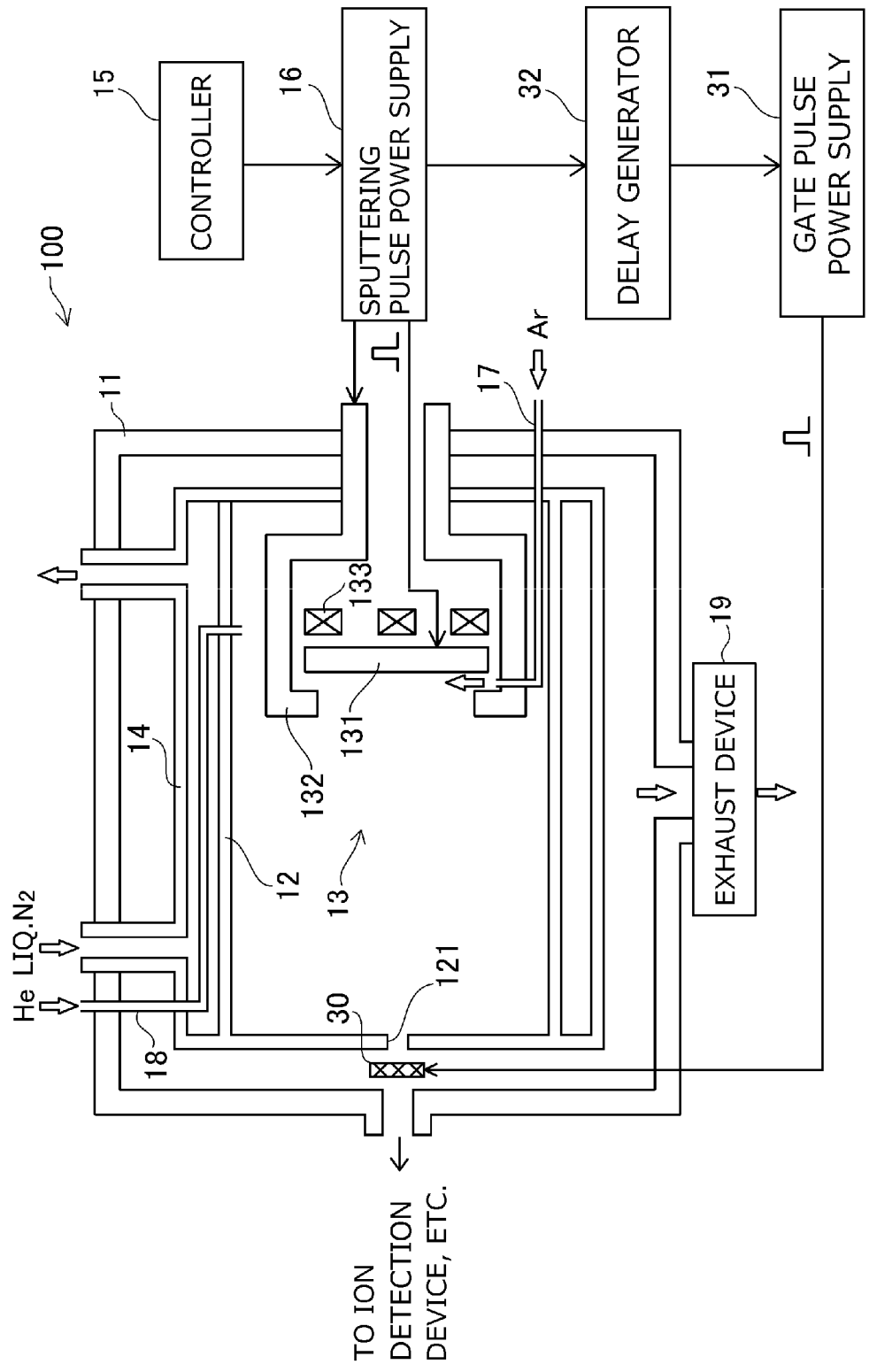
FIGS. 11A, 11B are conceptual construction diagrams of a nanocluster production apparatus according to a second embodiment of the present invention.
Figure 11B:
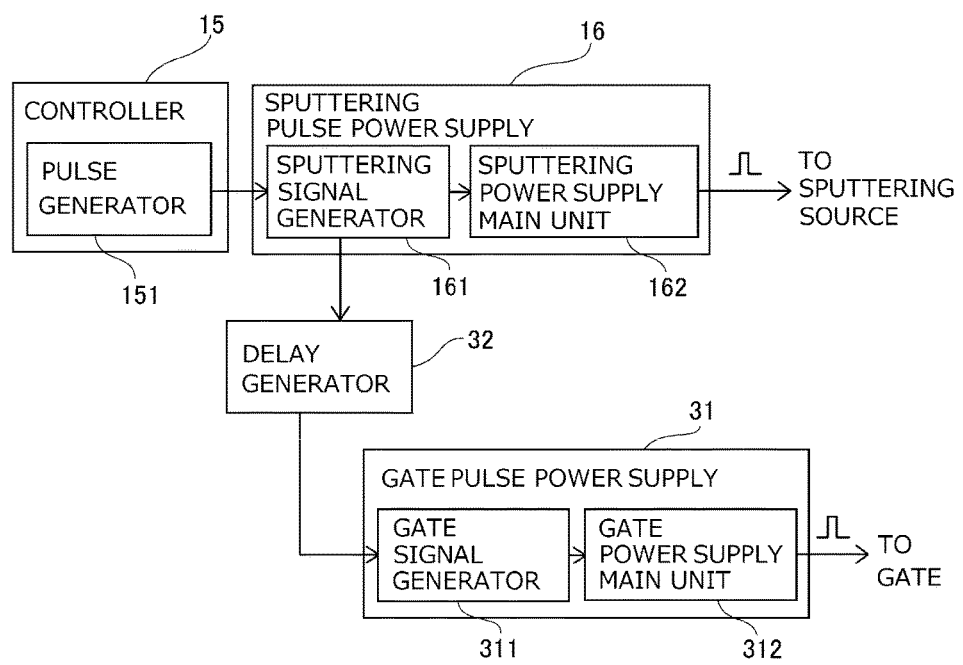

Next, a nanocluster production apparatus 100 according to a second embodiment of the present invention will be explained with reference to FIGS. 11A, 11B. As shown in FIG. 11A, the nanocluster production apparatus 100 according to the present embodiment has a gate 30, which permits or prohibits passage of the nanocluster ions through the beam extraction aperture 121 of the nanocluster growth cell 12, a gate pulse power supply 31, and a delay generator 32 in addition to the construction of the nanocluster production apparatus 10 according to the first embodiment.

The gate 30 is a metal mesh electrode, for instance, and is installed near the beam extraction aperture 121 of the nanocluster growth cell 12 in the chamber 11. The gate 30 is used to permit or prohibit the passage of only the nanocluster ions having either polarity among the nanocluster ions.

Next, a control system and a control method of the nanocluster production apparatus 100 according to the present embodiment will be explained. As shown in FIG. 11B, the control system of the nanocluster production apparatus 100 is constituted by a controller 15, a sputtering pulse power supply 16, a delay generator 32, and the gate pulse power supply 31. The controller 15 has a pulse generator 151. Alternatively, instead of using the controller 15, a pulse generator may be incorporated in the sputtering pulse power supply 16. The sputtering pulse power supply 16 has a sputtering signal generator 161 and a sputtering power supply main unit 162. The gate pulse power supply 31 has a gate signal generator 311 and a gate power supply main unit 312.

When generating the nanoclusters, the pulse generator 151 generates a pulsed clock signal, and sends the clock signal to the sputtering signal generator 161 of the sputtering pulse power supply 16.

If the sputtering signal generator 161 receives the clock signal, the sputtering signal generator 161 generates a pulsed sputtering signal, sends the sputtering signal to the sputtering power supply main unit 162 and sends a synchronization signal to the delay generator 32. The sputtering power supply main unit 162 applies a pulsed high voltage to the sputtering source 13 while the sputtering signal is ON.

If the delay generator 32 receives the synchronization signal, the delay generator 32 generates a delay signal, which has a predetermined delay based on the synchronization signal, and sends the delay signal to the gate pulse power supply 31. If the gate signal generator 311 of the gate pulse power supply 31 receives the delay signal, the gate signal generator 311 generates a pulsed gate signal and sends the gate signal to the gate power supply main unit 312. The gate power supply main unit 312 applies a voltage to the gate according to the gate signal. For instance, the gate power supply main unit 312 applies a positive or negative voltage to the gate 30 while the gate signal is OFF.

Next, with reference to a timing chart of FIG. 12, pulse discharge control and gate control by the control system, which is constituted by the controller 15, the sputtering pulse power supply 16, the delay generator 32 and the gate pulse power supply 31, of the nanocluster production apparatus 100 will be explained. In the example shown in FIG. 12, if the sputtering signal is generated at time s1 based on the clock signal from the controller 15, a pulse discharge occurs on the sputtering source 13 at immediately subsequent time s3.

The sputtering signal generator 161 sends a synchronization signal to the delay generator 32 at the time s1. The delay generator 32 generates a delay signal, which has a predetermined delay based on the received synchronization signal, and sends the delay signal to the gate pulse power supply 31. If the gate signal generator 311 of the gate pulse power supply 31 receives the delay signal, the gate signal generator 311 generates a pulsed gate signal (t1 to t2) and sends the gate signal to the gate power supply main unit 312. The gate power supply main unit 312 applies the voltage to the gate 30 according to the gate signal. In this example, a positive voltage +V is applied to the gate while the gate signal is OFF, and the voltage applied to the gate is set to 0 V only while the gate signal is ON. While the positive potential +V is applied to the gate, the cluster cations emitted from the beam extraction aperture 121 of the cluster growth cell 12 are rejected by the gate 30 and cannot pass through the gate 30. Only while the potential of the gate 30 is 0 V, the cluster cations can pass through the gate 30 and enter the subsequent ion detection device or the like. The time frame (t1 to t2), in which the potential of the gate 30 is set to 0 V to permit the passage of the cluster ions having the polarity as the object of permission or prohibition of passage in this way, will be referred to as a passage permission window hereinafter.

Figure 13:
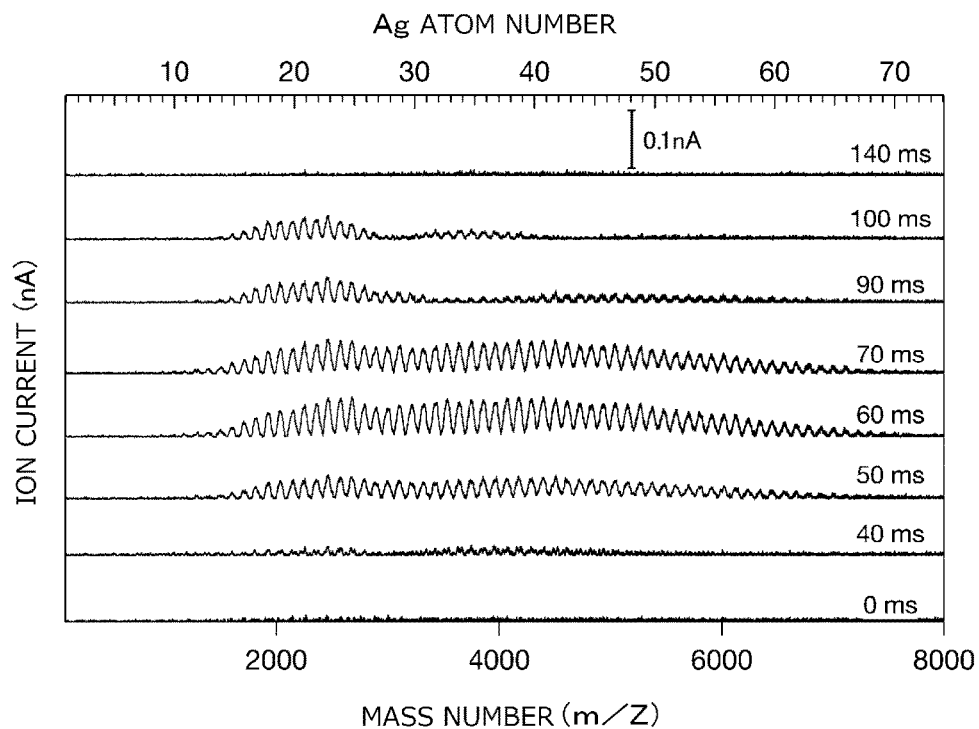
FIG. 13 is an illustrative diagram showing a temporal change of a size distribution of nanocluster ions.

A result of measurement of the size of the Ag nanocluster anion performed with the subsequent ion detection device (for instance, ion detection device 20 shown in FIG. 1) while changing in various ways the delay Δt from the rising time s1 of the sputtering signal to the rising time t1 of the gate signal in the above construction is shown in FIG. 13. FIG. 13 is a diagram, in which size distributions of the nanocluster ions at respective elapsed times after the rising time s1 of the sputtering signal are plotted and which shows the results at the elapsed times of 0 ms, 40 ms, 50 ms, 60 ms, 70 ms, 90 ms, 100 ms, and 140 ms respectively in this order from the bottom. As shown in FIG. 13, it is understood that the size distribution of the detected cluster ions changes as the time elapses after the sputtering signal is emitted and the pulse discharge starts. That is, it is understood that the cluster size has a time distribution. In this example, the cluster growth space length was set to 290 mm, the supplied voltage was set to 120 V, the repetition rate was set to 7 Hz, and the passage permission window was set to 4 ms.

Figure 14A:
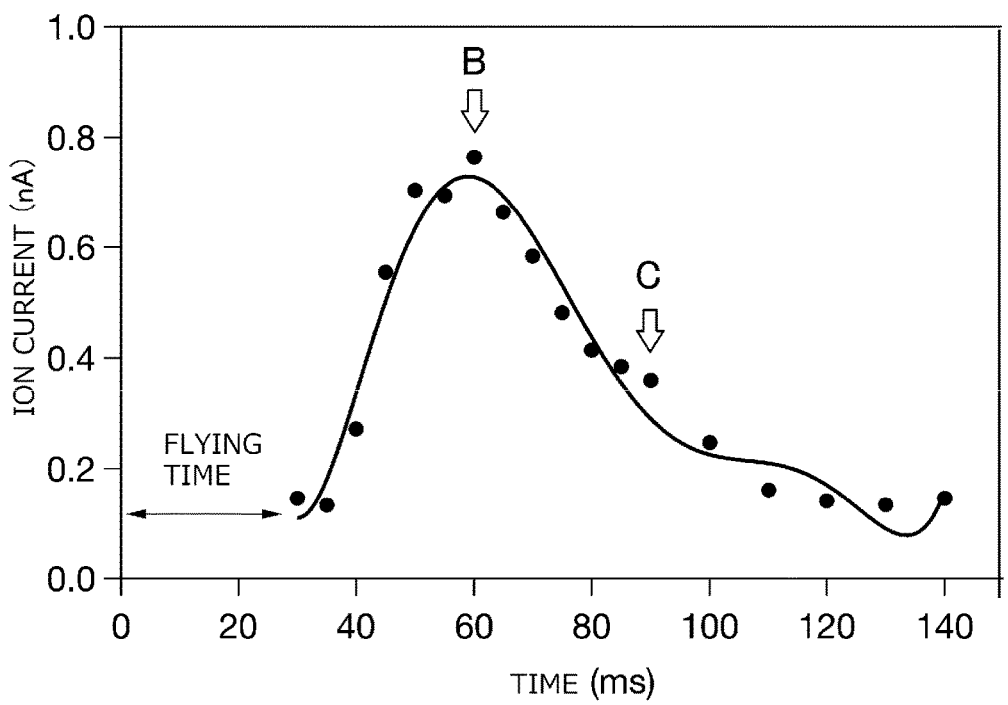
FIG. 14A is a diagram showing a temporal change of total intensity of the generated nanocluster ions.

It is understood that the ion current near the mass number of 4000 is high in the range of 50 ms to 70 ms, once becomes low at 90 ms and increases again at 100 ms in FIG. 13. Thus, it can be construed that there are nanoclusters having the same cluster size but different flight times. It is thought that a difference arises in the flight times of the nanoclusters having the same size from a difference in degrees of movement of the nanoclusters. That is, it is indicated that the nanoclusters having the same size but different structures (i.e., structural isomers) arrive at the gate 30 and are extracted in different time FIG. 14A is a diagram, in which the ion amount detected at each time during a single pulse discharge period is plotted with a black dot along a vertical axis, with a horizontal axis indicating an arrival time at the gate 30 after the sputtering on the target 131 is started. A solid curve is a guide for eyes. As shown in FIG. 14A, if the sputtering signal is emitted at time 0 and the discharge occurs immediately after that, the nanocluster ions begin to be detected after an elapse of a flight time, in which the nanocluster ions fly inside the cluster growth cell 12 and arrive at the gate 30 first.

Figure 14B:
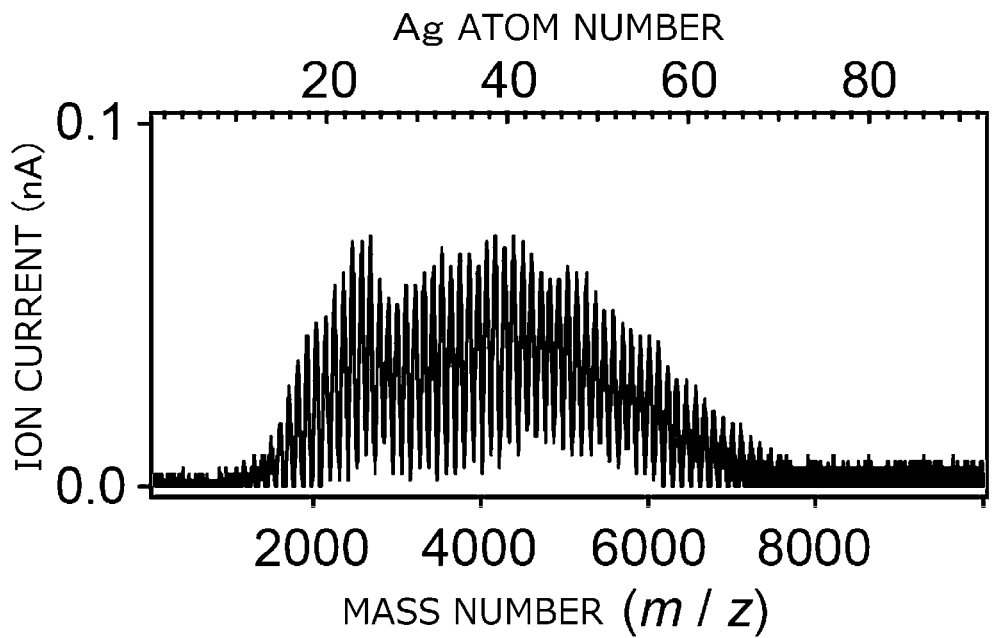
FIG. 14B is a diagram showing a size distribution of the nanocluster ions at timing B in FIG. 14A.
Figure 14C:
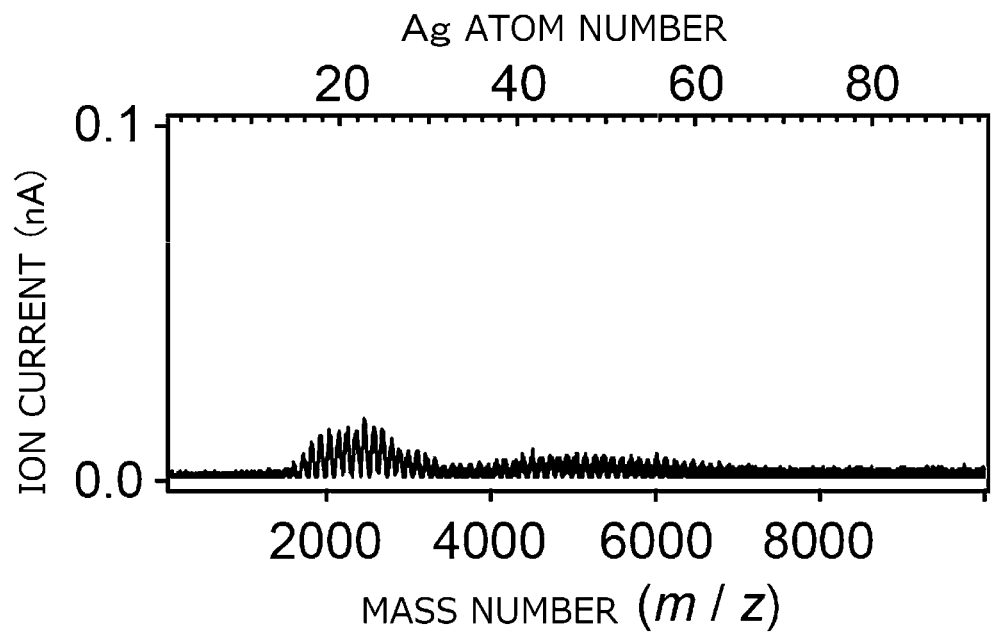
FIG. 14C is a diagram showing a size distribution of the nanocluster ions at timing C in FIG. 14A.

By setting the passage permission window at time B, at which the generated amount of the ions peaks, only the cluster ions at the time can be extracted and can be measured with a specific measuring device. Thus, size distributions of the Ag nanocluster anions were measured and the result is shown in FIG. 14B. It is also understood from FIG. 14B that the cluster size distribution at the peak time point B has shifted to the larger side when compared with a cluster size distribution at a time point C in a later half of the pulse measured in a similar way (FIG. 14C).

Therefore, if the passage of the nanocluster ions is permitted only in the predetermined time period (i.e., passage permission window) synchronized with the pulse discharge by changing the delay Δt, the nanocluster beams having the size distribution controlled with high accuracy can be obtained. By repeating the same process for every repetition period, the obtained amount of the nanocluster beams having the size distribution controlled with high accuracy can be increased.

The gate 30 is the metal mesh in the example of FIG. 11A but the present invention is not limited thereto. That is, any device that can permit or prohibit the passage of the cluster ions or that can change a flight trajectory of the nanocluster ions by using an electric field, a magnetic field or an electromagnetic field (for instance, deflector, Wien filter and the like) can be used as the gate 30. Furthermore, if the neutral nanoclusters are ionized by laser irradiation, electron irradiation or the like, an operation to permit or prohibit the passage of the nanocluster ions originating from the neutral clusters can be also performed with the gate 30.

Furthermore, a device that can perform an operation to prohibit or permit the passage of the beam by blocking or unblocking the flight trajectory of the beam physically (for instance, shutter), a device that changes the flight trajectory of the beam physically (for instance, gas injector capable of performing pulse injection of gas), or a mechanical device such as a disk that has a predetermined slit/slits and that can rotate at high speed may be used instead of the gate 30. Such devices can be used as the gate for both of the neutral nanoclusters and the nanocluster ions.

Third Embodiment

Figure 15:
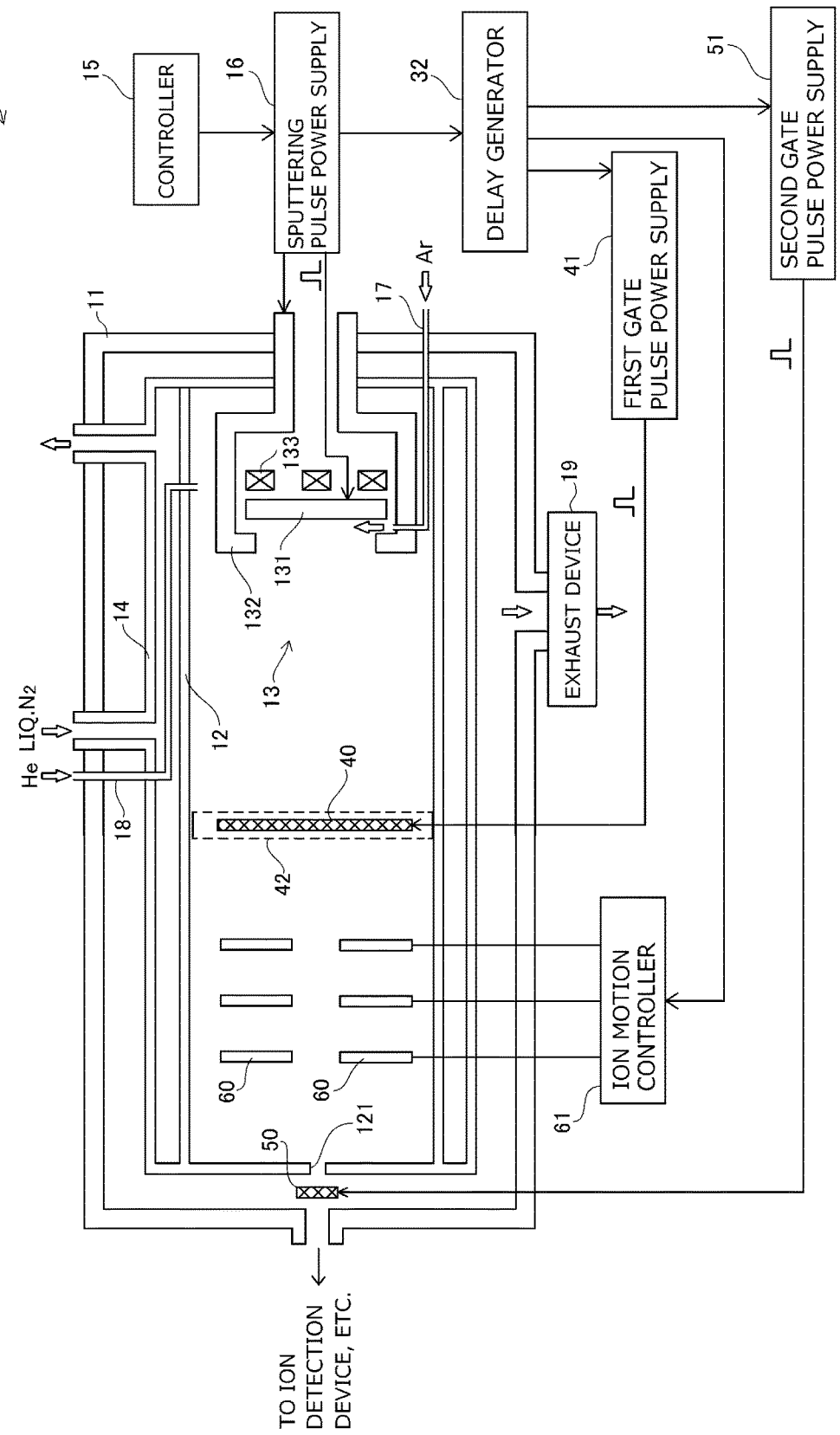
FIG. 15 is a conceptual construction diagram of a nanocluster production apparatus according to a third embodiment of the present invention.

Next, a nanocluster production apparatus 200 according to a third embodiment of the present invention will be explained with reference to FIG. 15. The nanocluster production apparatus 200 according to the present embodiment is characterized by having a gate also inside the cluster growth cell 12. That is, as shown in FIG. 15, the nanocluster production apparatus 200 has a first gate 40 installed inside the cluster growth cell 12 and a second gate 50 installed near the beam extraction aperture 121 of the cluster growth cell 12 as gates. Further, the nanocluster production apparatus 200 has a first gate pulse power supply 41 for the first gate 40 and a second gate pulse power supply 51 for the second gate 50. Furthermore, in order to avoid the voltage applied to the first gate 40 from affecting the upstream and downstream electric fields, the nanocluster production apparatus 200 has a metallic ground shield 42 (for instance, metal mesh) covering the first gate 40. The potential of the ground shield 42 is set to the same potential as the cluster growth cell 12. The first gate 40 extends near the center of the interior space of the cluster growth cell 12.

The interior space of the cluster growth cell 12 is divided by the first gate 40 into an upstream space and a downstream space. The passage of the nanocluster ions, which have grown in the upstream space, through the first gate 40 can be permitted or prohibited by performing control of the first gate 40 similar to the control explained in the description of the second embodiment. That is, by setting a predetermined passage permission window for the first gate 40, only nanocluster cations or nanocluster anions having a specific size distribution can be selectively caused to pass through the first gate 40.

In the present embodiment, the interior space of the cluster growth cell 12 downstream of the first gate 40 is constructed as a space for controlling the flight trajectory or velocity of the nanocluster ions having passed through the first gate 40. The construction shown in FIG. 15 performs promotion or suppression of the growth of the nanocluster ions or selection and control of the size or the structure of the nanocluster ions by accelerating or decelerating the passing nanocluster ions or by changing the flight trajectory of the passing nanocluster ions using a difference in the mass or in the degree of movement of the nanocluster ions with multiple ion motion control electrodes 60 installed inside the cluster growth cell 12. The ion motion control electrodes 60 are controlled by applying a voltage with an ion motion controller 61. The ion motion controller 61 is controlled by a control signal emitted from the delay generator 32 in synchronization with the sputtering signal.

The method of controlling the flight trajectory or the velocity of the nanocluster ions is not limited to the above. Any construction may be used as long as the construction can control the flight trajectory or the velocity of the nanocluster ions.

Fourth Embodiment

Figure 16A:
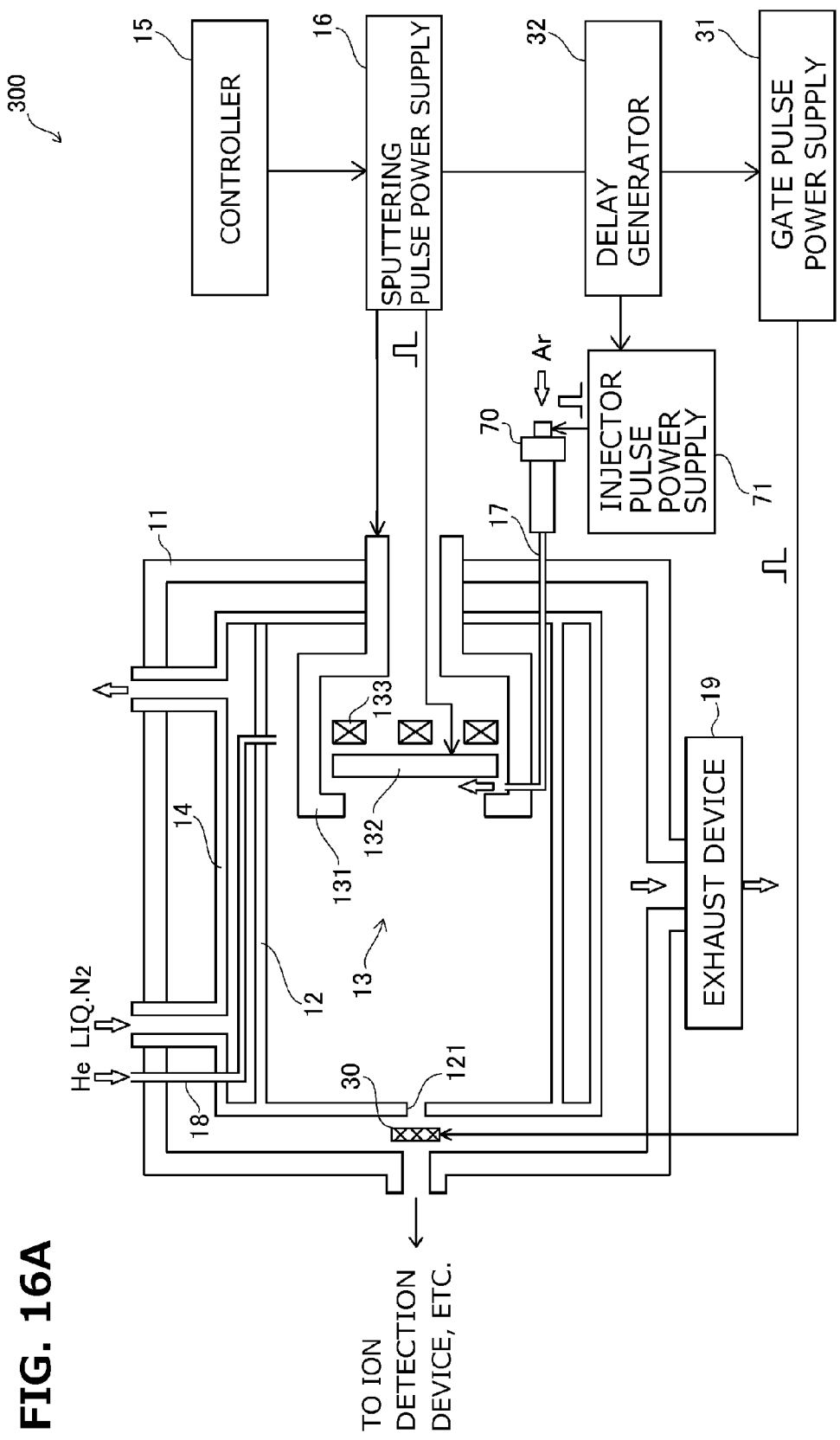
FIGS. 16A, 16B are conceptual construction diagrams of a nanocluster production apparatus according to a fourth embodiment of the present invention.
Figure 16B:
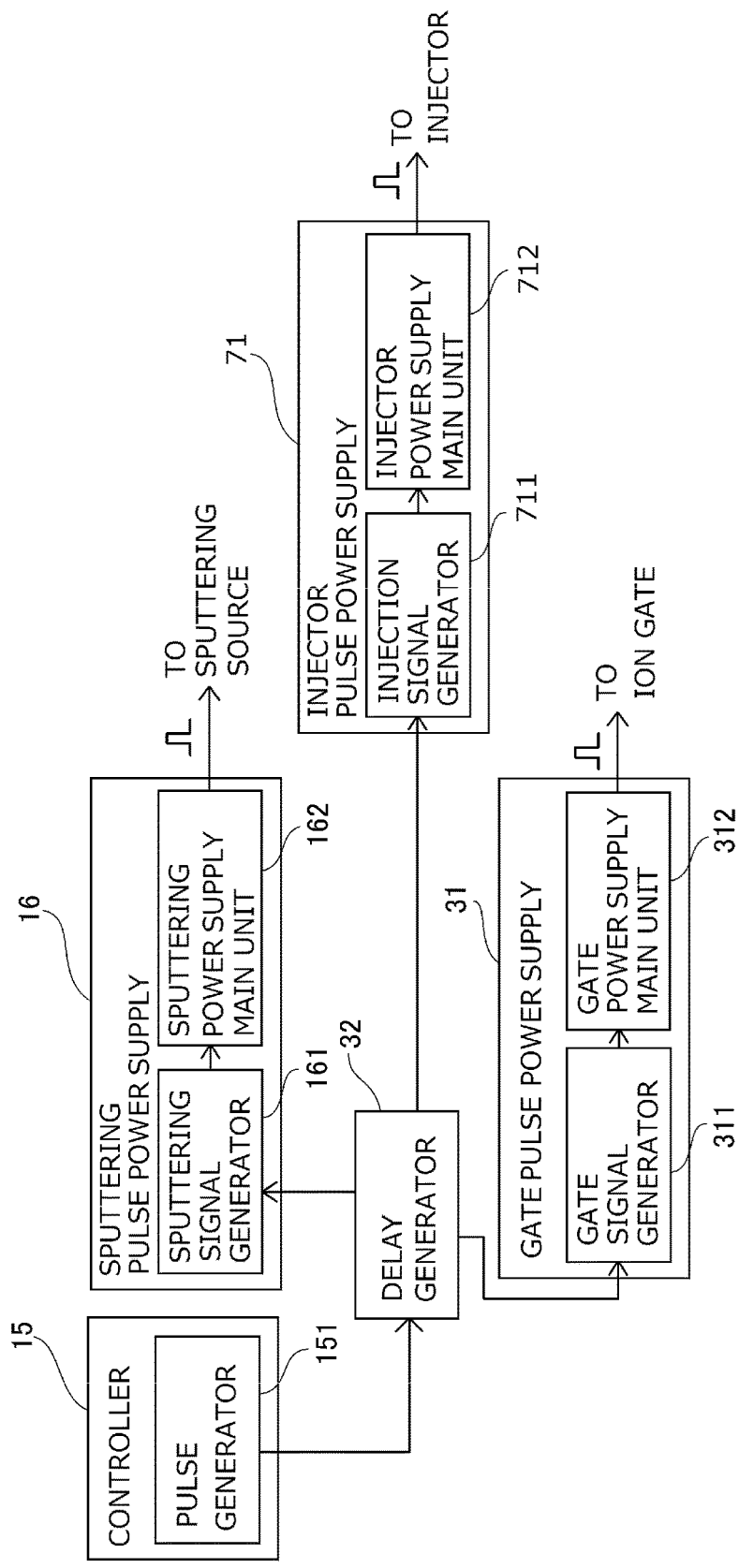

Next, a nanocluster production apparatus 300 according to a fourth embodiment of the present invention will be explained with reference to FIGS. 16A, 16B. As shown in FIG. 16A, the nanocluster production apparatus 300 according to the present embodiment has an injector 70 for injecting an Ar gas as the first inert gas and an injector pulse power supply 71 that controls an operation of the injector 70 in addition to the construction of the nanocluster production apparatus 10 of the first embodiment. Thus, pulse injection of the Ar gas can be performed. The injector 70 is installed outside the chamber 11, and the pulsed power is supplied from the injector pulse power supply 71 to the injector 70, whereby the Ar gas can be injected intermittently through the first inert gas supply pipe 17. The Ar gas injected from the opening of the first inert gas supply pipe 17 shoots from a spot or spots of the inner peripheral surface of the anode 132 near the sputtering surface of the target 131 substantially in parallel with the target 131 and spreads at a predetermined angle. The Ar gas is supplied from a high-pressure gas feed unit (not shown) to the injector 70. The high-pressure gas feed unit consists of an Ar gas tank storing the Ar gas, a pressure regulator and the like, for instance.

An automotive fuel injector (e.g., injector for diesel engine) can be used as the injector 70, for instance. As for classification by a drive system of the injector, an electromagnetic injector or a piezo injector may be used. Any injector of any system may be used if it can perform a drive described below.

Next, a control system and a control method of the nanocluster production apparatus 300 according to the present embodiment will be explained. The control system of the nanocluster production apparatus 300 is constituted by a controller 15, a sputtering pulse power supply 16, a delay generator 32, a gate pulse power supply 31 and an injector pulse power supply 71 as shown in FIG. 16B. The injector pulse power supply 71 has an injection signal generator 711 and an injector power supply main unit 712. The other construction is the same as that of the second embodiment.

The pulse generator 151 generates a pulsed clock signal and sends the clock signal to the delay generator 32. The delay generator 32 is a multi-channel delay unit and generates a first delay signal having a first delay based on the clock signal, a second delay signal having a second delay different from the first delay and a third delay signal having a further different third delay. The delay generator 32 sends the first delay signal to the sputtering pulse power supply 16, sends the second delay signal to the injector pulse power supply 71 and sends the third delay signal to the gate pulse power supply 31.

If the sputtering signal generator 161 of the sputtering pulse power supply 16 receives the first delay signal, it generates a pulsed sputtering signal and sends the sputtering signal to the sputtering power supply main unit 162. The sputtering power supply main unit 162 applies a pulsed high voltage to the sputtering source 13 while the sputtering signal is ON.

If the injection signal generator 711 of the injector pulse power supply 71 receives the second delay signal, it generates a pulsed injection signal and sends the injection signal to the injector power supply main unit 712. The injector power supply main unit 712 supplies a pulsed power to the injector 70 according to the injection signal (for instance, it applies voltage to injector 70 while injection signal is ON).

Thus, when the Ar gas is supplied from the injector 70 to the space near the sputtering surface of the target 131 and the discharge occurs on the sputtering source 13, sputtered particles are emitted from the target 131. Subsequent operation is the same as that of the second embodiment including the operation of the gate 30. Specifically, the control of the sputtering pulse power supply 16 and the gate pulse power supply 31 is substantially the same as that of FIG. 12 except that the present embodiment uses the two delay signals.

Figure 17:
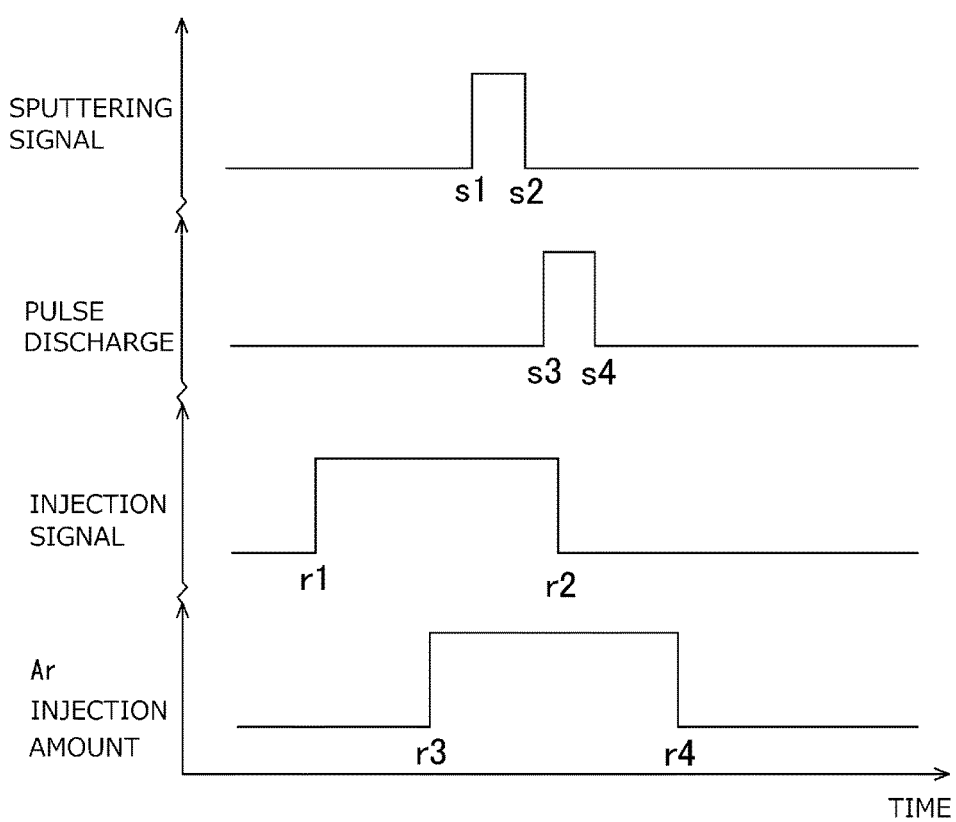
FIG. 17 is a timing chart for explaining a control example of the nanocluster production apparatus according to the fourth embodiment.

Next, pulse discharge control and inert gas supply control by the control system according to the present embodiment will be explained with reference to FIG. 17. In the example shown in FIG. 17, if the sputtering signal is emitted at time s1, the pulse discharge occurs on the sputtering source 13 at time s3 when a delay, which differs among the systems, passes.

If the injection signal is emitted at time r1, an actuator of the injector 70 starts driving. Thus, injection of the Ar gas from an injection hole of the injector 70 starts at time r3 when a delay passes after the time r1.

If the injection signal changes to OFF at time r2, the injection of the Ar gas ends at time r4 when a delay passes.

In this series of operations, the delay generator 32 suitably controls the transmission start time s1 of the sputtering signal and the transmission start time r1 of the injection signal with the first and second delay signals, the sputtering signal generator 161 suitably controls the transmission end time s2 of the sputtering signal (or duration of sputtering signal), and the injection signal generator 711 suitably controls the transmission end time r2 of the injection signal (or duration of injection signal) such that the entire period s3 to s4, in which the pulse discharge actually occurs, is included in the period r3 to r4, in which the Ar gas is actually injected.

With such the construction, while the supplied amount of the Ar gas can be reduced significantly as compared to the case where the Ar gas is supplied continuously, a necessary amount of the Ar gas can be supplied surely in a period, in which the Ar gas is actually used, i.e., a period from immediately anterior timing to immediately posterior timing to the period, in which the pulse discharge occurs.

It is desirable to set the delays of the first and second delay signals appropriately such that a predetermined delay is set from the time r3 when the injection of the Ar gas is actually started to the time s3 when the pulse discharge is actually started. Thus, the pulse discharge can be caused in the state where the sufficient amount of the Ar gas for the sputtering is supplied to the target 131.

Also, it is desirable to set a predetermined delay from the time s4 when the actual pulse discharge ends to the time r4 when the actual injection of the Ar gas ends. Thus, the injection of the Ar gas can be continued to timing after the completion of the sputtering. Thus, blockage of the injection hole of the injector 70 due to deposition of the sputtered particles (metal particles and the like) can be inhibited with the flow of the Ar gas that continues to shoot from the injection hole of the injector 70.

In order to obtain a sufficient effect of reducing the sizes of the devices for supplying and exhausting the Ar gas by the intermittent supply of the Ar gas, it is desirable to set the duty ratio of the injector 70 (ratio of time in which injector 70 actually injects) to 50% or lower.

In this embodiment, the tip end of the first inert gas supply pipe 17 is constructed to inject the first inert gas from one or more spots between the target 131 and the anode 132 of the sputtering source 13. The present invention is not limited thereto. Alternatively, any construction can be employed as long as the construction can supply the first inert gas such that the first inert gas heads to the target 131.

As long as the injector 70 can inject and supply the Ar gas toward the target 131, the injector 70 may be installed in the chamber 11, in the cluster growth cell 12 or in the sputtering source 13.

Modification

Figure 12:
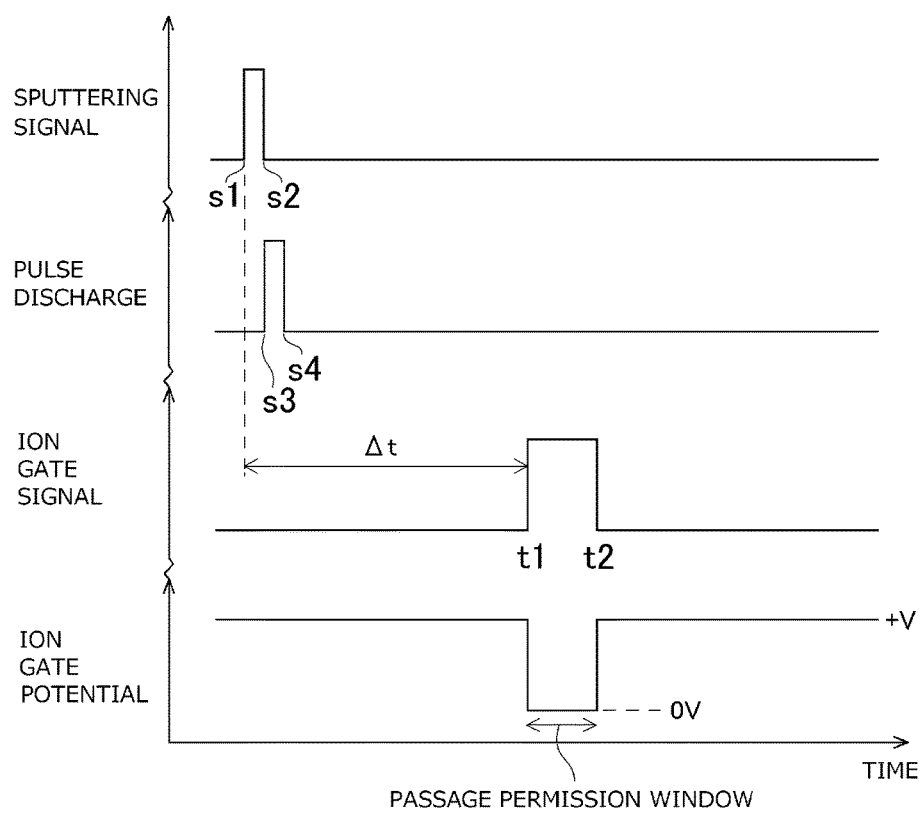
FIG. 12 is a timing chart for explaining a control example of the nanocluster production apparatus according to the second embodiment.

In the above embodiments, the sputtering signal emitted by the sputtering signal generator 161 of the sputtering pulse power supply 16 is a single pulse signal (refer to FIG. 12). Alternatively, the sputtering signal may be emitted as a signal group composed of multiple micro pulse signals as shown in an upper part of FIG. 18. In this case, the sputtering signal generator 161 may be constructed with a micro pulse generator. For instance, a modulated pulse power supply can be used. For instance, pulse width of each micro pulse signal may be approximately 10 microseconds. A plurality of the micro pulse signals are emitted successively to emit a sputtering signal as a signal group that extends for a period of approximately 100 microseconds to 3 milliseconds as a whole. The sputtering power supply main unit 162 supplies the power to the sputtering source 13 according to the received sputtering signal.

Figure 18:
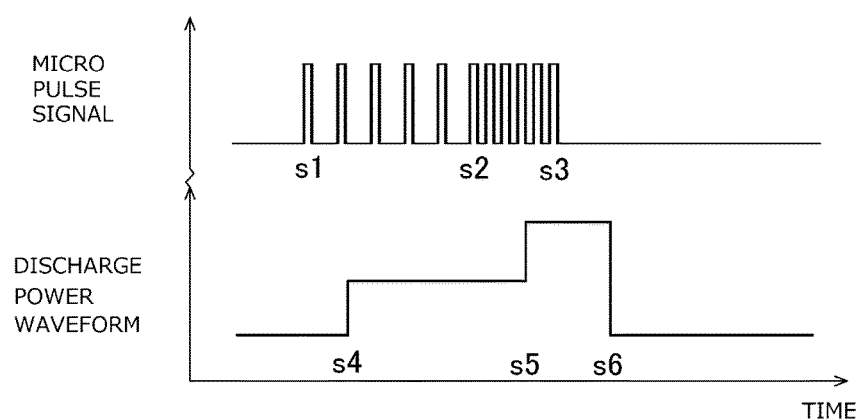
FIG. 18 is a timing chart for explaining a control example of a nanocluster production apparatus according to a modified example of the present invention.

With such the construction, the supplied power can be varied during the discharge period of each cycle by controlling the respective micro pulse signals. In the example of FIG. 18, frequency of the micro pulse signals is set relatively low in the period from s1 to s2 (i.e., micro pulse signal group is made sparse), and the frequency of the micro pulse signals is set relatively high during the period from s2 to s3 (i.e., micro pulse signal group is made dense). Thus, the power supplied to the sputtering source 13 takes a relatively low value during the period from s4 to s5 in an early stage of the application of the power and takes a relatively high value during the period from s5 to s6 after that and until the end of the application of the power. Thus, plasma based on Ar can be lit by a relatively weak discharge in the early stage of the discharge, and a larger volume of the plasma can be generated in a later stage of the discharge. Such the mode of the generation of the plasma is desirable for generation of more stable plasma and also for discharge of a larger amount of the sputtered particles. The present invention is not limited to varying the frequency of the micro pulse signals. Alternatively, or in addition to it, a duty ratio of the micro pulse signals may be varied. A voltage value of the sputtering power supply main unit 162 may be varied. The injection signal generator 711 may be also constructed with a micro pulse generator like the sputtering signal generator 161.

In the above embodiments, the sputtering source 13 is installed in the cluster growth cell 12, but the present invention is not limited thereto. That is, the sputtering source 13 may be arranged outside the cluster growth cell 12 as long as the sputtering source 13 is inside the chamber 11 and the sputtered particles sputtered from the target 131 of the sputtering source 13 can promptly enter the inside of the cluster growth cell 12 immediately after being sputtered.

It is also possible to use the ground shield 42, which is used in the third embodiment shown in FIG. 15, for the gates 30, 50 installed near the beam extraction aperture 121 of the cluster growth cell 12 to avoid influence on the upstream or downstream potential.

In the above embodiments, the cooling jacket 14 using the liquid nitrogen is used, but the present invention is not limited thereto. Alternatively, for instance, a construction for introducing the liquid helium into the cluster growth cell 12 may be employed and the cooling jacket 14 may be omitted. Also in this case, similar effects about the production and the growth of the nanoclusters can be acquired.

The configuration of the control system explained in the above description of each of the embodiments (FIG. 11B, FIG. 16B and the like) is only an example. Any system configuration may be used as long as it can perform control similar to above-mentioned each control. For instance, a construction that the clock signal from the pulse generator 151 of FIG. 11B is sent directly to the delay generator 32 may be used.

Another Working Example

Figure 19:
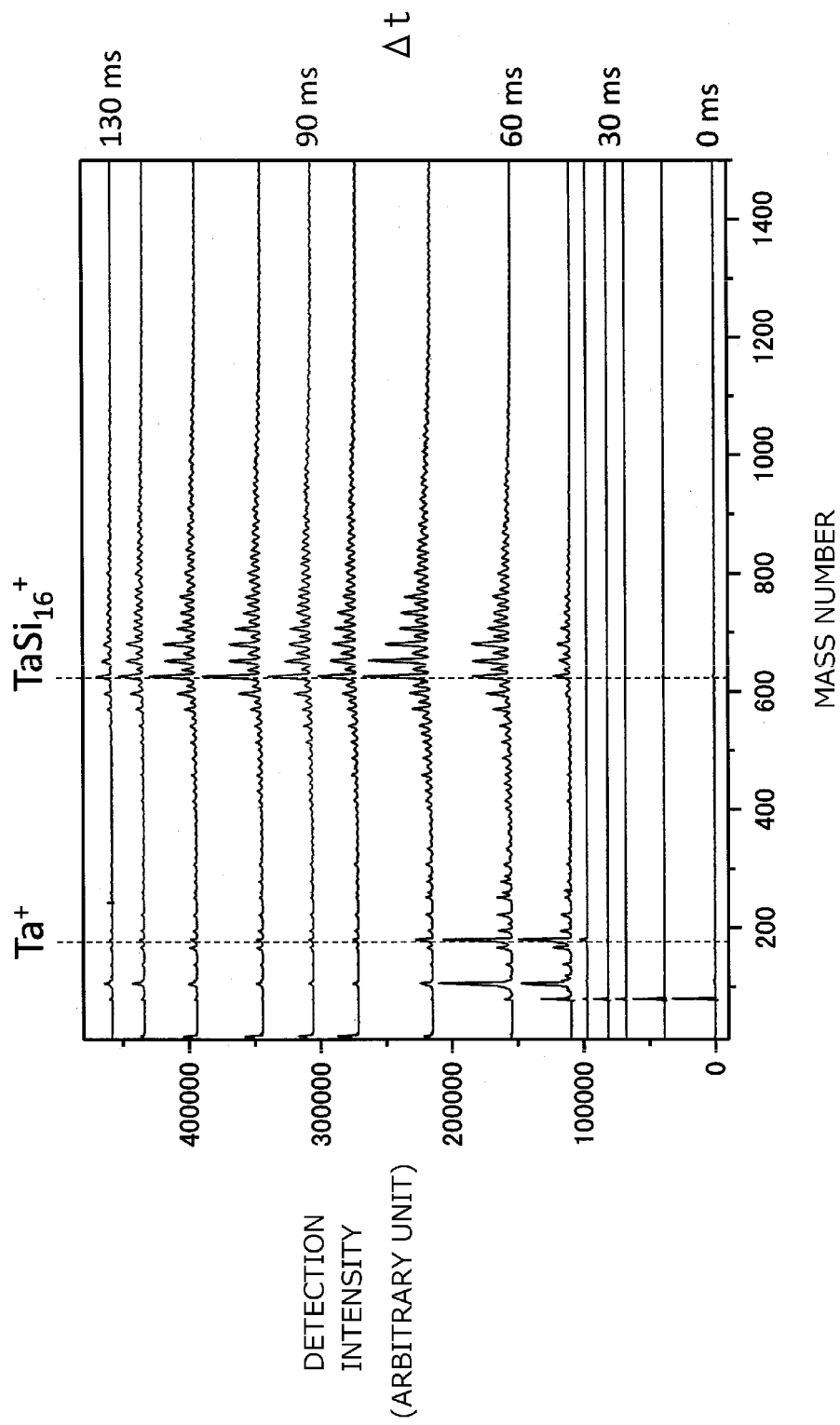
FIG. 19 is a graph showing another working example of the present invention.

Another working example of the present invention is shown in FIG. 19. Here, a result of an experiment for production of TaSi composite nanocluster ions using the construction of FIGS. 11A, 11B is shown. A target made by pressing powder of TaSi alloy (Ta: 16 wt %) was used as the target 131. FIG. 19 is a diagram showing temporal change of generation intensity of the TaSi composite nanocluster cations. Experimental conditions are as follows.

Experimental Conditions

He flow rate: 300 sccm
Ar flow rate: 80 sccm
Cluster growth space length: 280 mm
Pulse repetition period: 7 Hz
About modulated pulse:
Initial low output pulse: 1.0 ms
Subsequent high output pulse: 1.4 ms
Discharge voltage (highest part of pulse): −400 V
Discharge current (highest part of pulse): 1.7 A
Discharge power (highest part of pulse): 0.7 kW
About gate (30) pulse:
Gate voltage (blocking electric field): +10 V
Passage permission window width: 10 ms In FIG. 19, a vertical axis on the right side indicates the delay Δt shown in FIG. 12, and a horizontal axis indicates the size (mass number) of the detected nanocluster. Another vertical axis on the left side indicates detection intensity (arbitrary unit) of the nanocluster. Each mass spectrum was measured by changing the delay Δt by 10 ms each. The delay Δt increases toward the upper side of FIG. 19. As shown in FIG. 19, the result was that the intensity of $Ta^+$ (m=181 a.m.u.) was high when the delay Δt was in the range from 40 ms to 60 ms and that the intensity of the TaSi composite nanocluster cation ($TaSi_n^+$) (m=400 to 900 a.m.u.) was high when the delay Δt was in the range from 60 to 130 ms. Thus, it is understood that the composition of the produced nanocluster differs depending on the delay from the sputtering. The intensity of $TaSi_{16}^+$ (m=630 a.m.u.), which is specifically stable among the TaSi composite nanoclusters, is maximum in the range from 100 to 120 ms.

Accordingly, the nanocluster beam having the composition and the size distribution controlled with high accuracy can be obtained by changing the delay Δt and by permitting the passage of the nanocluster ions only in the predetermined time window synchronized with the pulse discharge.

Thus, it was shown that the nanocluster production technique using the nanocluster production apparatus according to the present invention can be applied also to the nonmetallic target and that the technique can be applied also to the two-component composite.

The constructions and the control methods explained in the description of the above embodiments, the working examples and the modifications can be combined arbitrarily and used as long as it is possible. Such combinations also belong to the present invention.

EXPLANATION OF REFERENCE NUMERALS

10, 100, 200, 300 Nanocluster production apparatus
11 Chamber
12 Cluster growth cell
13 Sputtering source
14 Cooling jacket
15 Controller
16 Sputtering pulse power supply
17 First inert gas supply pipe
18 Second inert gas supply pipe
19 Exhaust device
20 Ion detection device
21 Ion guide
22 Quadrupole ion deflector
23 Quadrupole mass spectrometer
24 Ion detector
30 Gate
31 Gate pulse power supply
32 Delay generator
40 First gate
41 First gate pulse power supply
42 Ground shield
50 Second gate
51 Second gate pulse power supply
60 Ion motion control electrode
61 Ion motion controller
70 Injector
71 Injector pulse power supply

The invention claimed is:

1. A nanocluster production apparatus comprising:
a vacuum chamber;
a sputtering source comprising a target as a cathode within the vacuum chamber, the sputtering source generates plasma by pulsed discharge;
an anode in which the sputtering source is positioned within;
a pulse power supply that supplies a pulsed power to the sputtering source;
a first inert gas supply device that supplies a first inert gas directly inside the anode to the sputtering source;
a cluster growth cell within the vacuum chamber; and
a second inert gas introduction device that introduces a second inert gas directly into the cluster growth cell but at a location outside the anode, so that sputtered particles originating from the sputtering source are entrained in a flow of the second inert gas, the second gas serving as a coolant gas for cooling a sputtered particle injected from the sputtering source, the second inert gas different from the first inert gas; wherein
the sputtering source, target, and anode all being housed within the cluster growth cell,
a sputtering surface of the target and an inner surface of the cluster growth cell define a cluster growth space for causing a growth of nanoclusters,
the cluster growth cell has a beam extraction aperture configured to extract the nanoclusters produced in the cluster growth cell as a beam,
the nanocluster production apparatus has a gate outside the cluster growth cell that permits or prohibits the extraction of the beam from the beam extraction aperture, wherein permitting is by having zero applied voltage to the gate and prohibiting is by having an applied potential to the gate and further
comprising a controller configured to set a timing of the gate for switching between a permission and a prohibition of the extraction of the beam from the beam extraction aperture, wherein the timing of the gate for switching is synchronized with every start timing of supply of the pulsed power to the sputtering source.

2. The nanocluster production apparatus as in claim 1, wherein the controller controls the pulse power supply to vary a duty ratio of the pulsed power and a peak discharge power.

3. The nanocluster production apparatus as in claim 2, wherein the controller varies at least one of the duty ratio of the pulsed power and the peak discharge power according to at least one of length of the cluster growth space defined by distance from the sputtering surface of the target to the beam extraction aperture and a temperature and pressure of the second inert gas in the cluster growth cell.

4. The nanocluster production apparatus as in claim 2, wherein the controller controls the pulse power supply to vary repetition rate of the pulsed power.

5. The nanocluster production apparatus as in claim 4, wherein the controller varies at least one of the duty ratio of the pulsed power and the peak discharge power according to at least one of length of the cluster growth space defined by distance from the sputtering surface of the target to the beam extraction aperture and a temperature and pressure of the second inert gas in the cluster growth cell.

6. The nanocluster production apparatus as in claim 1, wherein the controller sets a period for permitting the extraction of the beam and a period for prohibiting the extraction of the beam from the beam extraction aperture as a regular pattern synchronized with the pulsed discharge and repeats the permission and the prohibition of the extraction of the beam from the beam extraction aperture according to the set pattern and in synchronization with a repetition period of the pulsed power.

7. The nanocluster production apparatus as in claim 1, wherein the controller varies the timing for switching between the permission and the prohibition of the extraction of the beam, thereby controlling at least one of a size and a structure of the nanoclusters extracted through the beam extraction aperture.

8. The nanocluster production apparatus as in claim 1, wherein the gate permits or prohibits the extraction of the beam from the beam extraction aperture with an electric field, a magnetic field or an electromagnetic field.

9. The nanocluster production apparatus as in claim 1, wherein the gate prohibits or permits the extraction of the beam from the beam extraction aperture by changing, blocking or unblocking a flight trajectory of the beam.

10. The nanocluster production apparatus as in claim 1, further comprising another gate installed inside the cluster growth cell for permitting or prohibiting the passage of the nanoclusters.

11. The nanocluster production apparatus as in claim 1, wherein the first inert gas is an argon gas.

12. The nanocluster production apparatus as in claim 1, wherein the second inert gas is a helium gas.

13. The nanocluster production apparatus as in claim 1, wherein the first inert gas supply device has a gas injector for the first inert gas, and
the controller controls the sputtering source and the gas injector such that the gas injector injects the first inert gas intermittently and such that a period, in which the pulse discharge occurs in the sputtering source, is included in a period, in which the gas injector injects the first inert gas.

14. The nanocluster production apparatus as in claim 13, wherein the controller supplies a power to the gas injector according to an injection signal, which is a pulsed electric signal, thereby driving the gas injector to inject the first inert gas,
the controller constructs the injection signal with a group of a plurality of pulse signals, and
the controller varies a duty ratio or frequency of the plurality of pulse signals in the group constructing the injection signal.

15. The nanocluster production apparatus as in claim 1, wherein the controller supplies a pulsed power to the sputtering source according to a sputtering signal, which is a pulsed electric signal,
the controller constructs the sputtering signal with a group of a plurality of pulse signals, and
the controller varies a duty ratio or frequency of the plurality of pulse signals in the group constructing the sputtering signal.

* * * * *